(12) United States Patent
Ho

(10) Patent No.: US 7,551,503 B2
(45) Date of Patent: Jun. 23, 2009

(54) METHOD FOR REFRESHING A FLASH MEMORY

(75) Inventor: Lien-Che Ho, Hsinchu (TW)

(73) Assignee: MACRONIX International Co., Ltd., Hsinchu (TW)

(*) Notice: Subject to any disclaimer, the term of this patent is extended or adjusted under 35 U.S.C. 154(b) by 377 days.

(21) Appl. No.: 11/449,361

(22) Filed: Jun. 8, 2006

(65) Prior Publication Data

US 2006/0291294 A1    Dec. 28, 2006

Related U.S. Application Data

(60) Provisional application No. 60/694,052, filed on Jun. 24, 2005.

(51) Int. Cl.
*G11C 7/00* (2006.01)
(52) U.S. Cl. .................... 365/222; 365/189.07
(58) Field of Classification Search ................ 365/222, 365/189.07, 205, 207
See application file for complete search history.

(56) References Cited

U.S. PATENT DOCUMENTS

| | | | |
|---|---|---|---|
| 5,365,486 A | | 11/1994 | Schreck |
| 5,768,193 A | | 6/1998 | Lee et al. |
| 6,005,810 A | * | 12/1999 | Wu .................. 365/185.33 |
| 6,650,570 B2 | * | 11/2003 | Tanzawa et al. ...... 365/185.22 |
| 7,042,044 B2 | | 5/2006 | Wu |
| 2001/0006479 A1 | | 7/2001 | Ikehashi et al. |

OTHER PUBLICATIONS

Jitu J. Makwana et al. "A Nonvolatile Memory Overview," Copyright © 2004, printout from web site: http://aplawrence.com/Makwana/nonvolmem.html, printout date: Jun. 6, 2006, 21 pages.

* cited by examiner

*Primary Examiner*—Son Dinh
(74) *Attorney, Agent, or Firm*—Jiang Chyun IP Office

(57) ABSTRACT

A plurality of cells of a flash memory are tested to determine if they need to be refreshed. The cells are read and a plurality of different sensing ratios are used to determine if any of the cells need to be refreshed. Any cells that are determined to need refreshing are refreshed. The cells are read using only a single constant gate voltage.

18 Claims, 39 Drawing Sheets

EM=2<sup>nd</sup> bit effect+RT drift+Sensing deficiency
PM=data retention+array effect+temp effect + initial drop+sensing deficiency Charge loss bits, need refresh Charge gain bits, need discharge

METHOD FOR REFRESHING A FLASH MEMORY

CROSS-REFERENCE TO RELATED APPLICATIONS

This application claims the benefit of U.S. Patent Application No. 60/694,052, filed on Jun. 24, 2005, entitled "Method for refreshing a flash memory."

BACKGROUND OF THE INVENTION

A flash memory is a solid-state device, which is a nonvolatile and rewritable memory that functions like a combination of RAM (random access memory) and a hard disk drive, and retains its data without power. In a similar structure to EEPROMs, it has address lines, data lines and control lines and can employ a single transistor for each of its memory cells for storing a bit of information. Address lines are unidirectional to the memory as an input and define the location where data is stored. Data lines are bidirectional and are used for the input and output of data. Control lines are used to specify a command for reading, programming and erasing. Flash memory is a fast growing segment of the semiconductor industry and has many uses in digital cameras, cell phones, printers, PDAs and audio recorders and players for storing software and data.

Flash memory offers extremely fast access time, low power consumption and is relatively immune to shock and vibration. Maintaining data integrity in a flash memory is an important issue in today's commercial and consumer electronic devices that employ flash memory.

There are three operational functions for a flash memory. The first function is the program (write) function for storing information or data to the memory cells. The second function is the read function, where the data that is previously stored is read from the device for external processing. The data is retained in the device after the program or read function is complete. The third function is an erase function, where the data is deleted from the memory cells and the memory cells are prepared for receiving new data.

A typical flash memory cell is shown in FIG. 2 of U.S. Pat. No. 5,365,486 (Schreck). This flash memory cell is a modified NMOS (N-channel metal-oxide semiconductor) transistor with a floating gate. The floating gate carries no negative charges and thus the raw state of the flash memory cells are 1's.

There are many ways to program, read, verify and refresh the contents of a cell in a flash memory. For example, FIG. 3a of U.S. Pat. No. 5,365,486 (Schreck) shows two separate voltage levels for the control gate voltage that are used for comparing the cell. First, the cell is read and compared to an elevated control gate voltage (42). As a result of this read operation, it determines if the memory cell contains data (44). If the memory cell contains data, then the next memory cell is processed (46). If the initial test found the cell does not contain data (44), then it reads the memory cell at a lower control gate voltage (48). After this read operation, it determines whether this memory cell contains data (50). If the memory cell does not contain data, then the next memory cell is processed (46). If the memory cell contains data, then it refreshes the memory cell (52) and the next memory cell is processed (46).

As shown in FIG. 3a of U.S. Pat. No. 5,365,486 (Schreck) and FIG. 1 of U.S. Pat. No. 5,768,193 (Lee et al.), each uses two different WL voltage (control gate voltage) levels to determine whether the cells require refreshing. Since each WL voltage has a settling time, this influences the speed by increasing the time it takes to complete the operation. In addition, the use of two WL voltage levels increases disturbance issues at the gate that affects reliability and data retention.

BRIEF SUMMARY OF THE INVENTION

The present invention provides a method for refreshing a flash memory having a plurality of memory cells, wherein a single memory cell uses a constant control gate voltage, Vg, (i.e., WL voltage). The embodiments of the present invention include refreshing a flash memory cell for programming, reading, erasing and power on stage operations. An embedded algorithm is used to complete a comparison and determine which bits require refreshing during any operation, whether for programming, erasing, reading or the power on stage. Using a single and lower control gate voltage, the embedded algorithm can prevent gate disturbance issues, and provide greater endurance, faster operation and better data retention.

The present invention improves prior art schemes by providing an embedded checking method for high/low Vt (threshold voltage) for charge loss/gain bits during the program, erase, read and power on stage operations. Hence, the present invention method can detect higher charge loss bits and higher charge gain bits than prior art schemes.

BRIEF DESCRIPTION OF THE DRAWINGS

The following drawings provide examples of the invention. However, the invention is not limited to the precise arrangements, instrumentalities, scales, and dimensions shown in these examples, which are provided mainly for illustration purposes only. In the drawings.

DETAILED DESCRIPTION OF THE INVENTION

The many embodiments of the present invention, its advantages and concepts as related to the method for refreshing a flash memory are best understood by referring to the Figures.

1. Definitions

The following definitions are provided to promote understanding of the invention.

a. sensing ratio—SA (sense amplifier) signal voltage divided by RWL (read wordline) voltage b. Icell—measured (actual) cell current c. Iref—reference cell current d. Icell-0—cell current of a charge loss cell e. Icell-1—cell current of a charge gain cell f. V[Icell]—converted voltage of the measured (actual) cell current g. V[Iref]—converted voltage of the reference cell current h. V[(Icell-0)]—converted voltage of current in a charge loss cell i. V[(Icell-1)]—converted voltage of current in a charge gain cell j. V[Iref-R]—converted voltage of reference current of a charge loss cell k. V[Iref-RE]—converted voltage of reference current of a charge gain cell i. V[(Icell-0)×(X)]—converted voltage of a cell current of a charge loss cell using sensing ratio 1:X (X>1)

j. V[(Icell-1)×(Y)]—converted voltage of a cell current of a charge gain cell using sensing ratio 1:Y (Y<1)

k. V[(Iref)×(X)]—converted voltage of a reference cell current using sensing ratio 1:X (X>1)

l. V[(Iref)×(Y)]—converted voltage of a reference cell current using sensing ratio 1:Y (Y<1)

2. Detailed Disclosure

Figure 1:
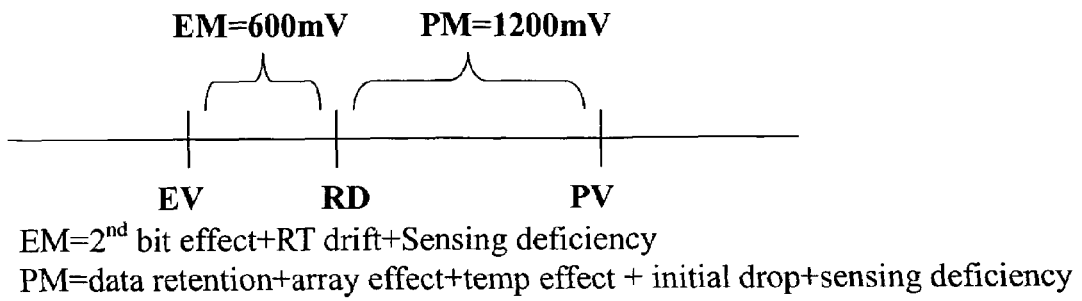
FIG. 1 is a diagram of a Flash high Vt (threshold voltage) and a low Vt read margin.

FIG. 1 is a diagram of the Flash high Vt (threshold voltage) and the low Vt read margin. The high Vt design parameters are defined by data retention, temperature effect, sensing deficiency, array effect and initial drop. The program margin (PM) is the total sum of the high Vt design parameters. The low Vt design parameters are defined by charge gain, temperature effect, sensing deficiency, and $2^{nd}$ bit effect and cycle margin. The erase margin (EM) is the total sum of low Vt design parameters.

Figure 2:
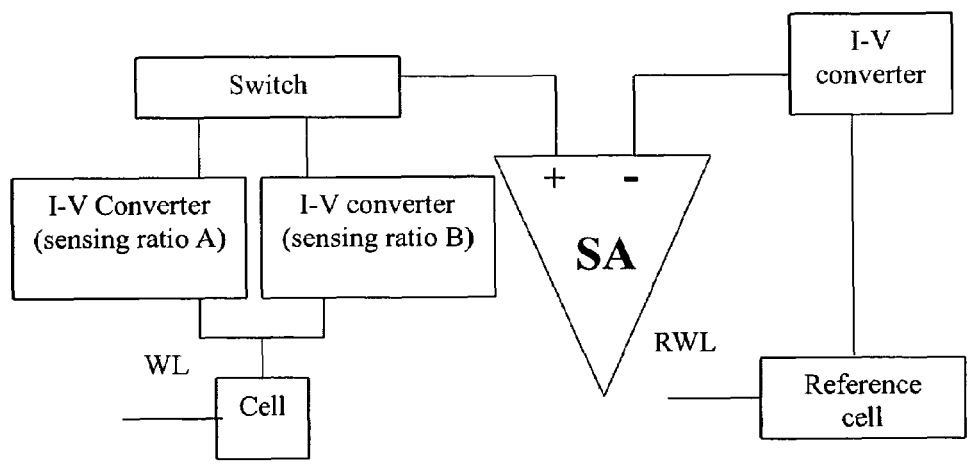
FIGS. 2-4 show schematic diagrams for the sensing ratio at the cell side of a flash memory.
Figure 3:
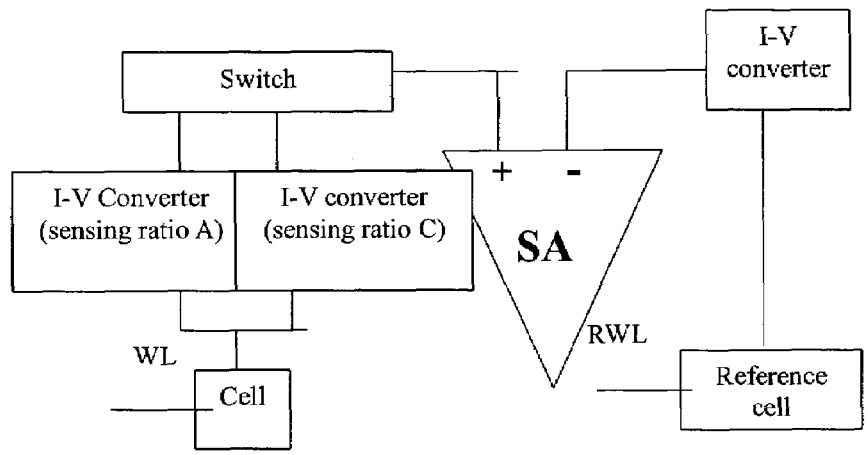
Figure 4:
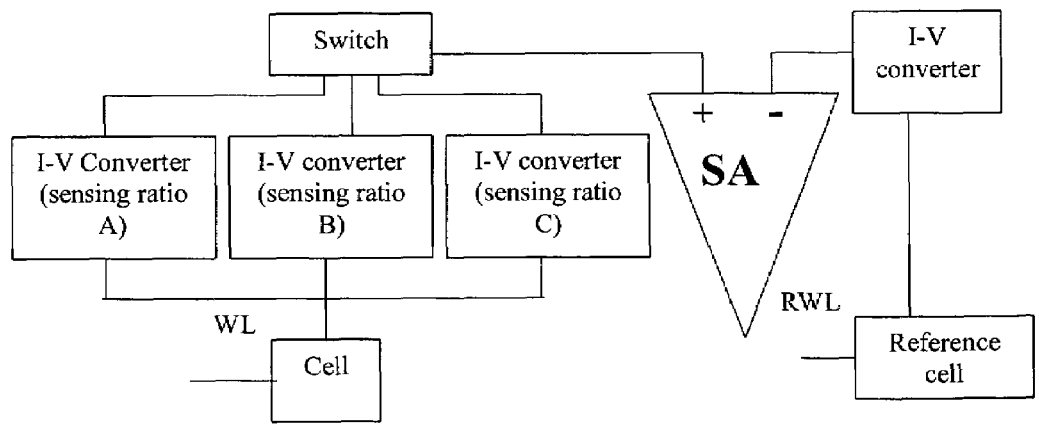

FIGS. 2-4 show schematic diagrams for the sensing ratio at the cell side of the flash memory where FIG. 2 judges the high Vt charge loss cells, FIG. 3 judges the low Vt charge gain cells, and FIG. 4 judges both high Vt charge loss cells and low voltage charge gain cells. FIGS. 2-4 show I-V converters that directly convert the cell current to a voltage.

Figure 5:
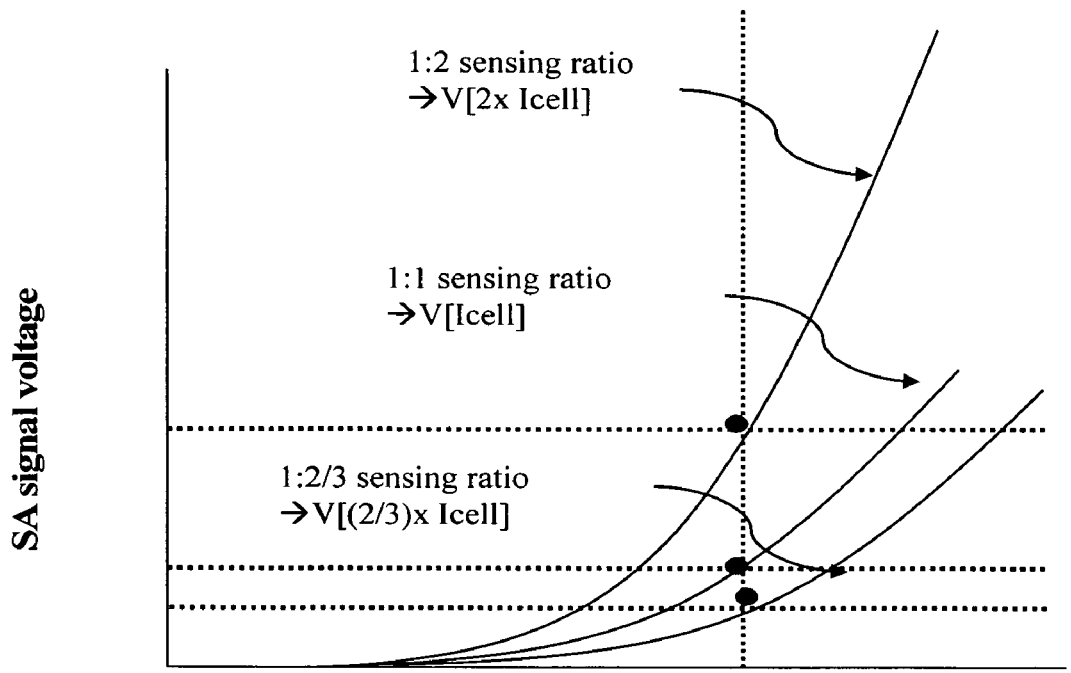
FIG. 5 shows a graph for an SA signal voltage versus a WL voltage for sensing ratios shown in FIGS. 2-4.

FIG. 5 shows a graph for the SA signal voltage versus the WL voltage for sensing ratios A, B and C of FIGS. 2-4. For example, the sensing ratio for A is 1:1, B is 1:X (X>1) where X equals 2, and C is 1:Y (Y<1) where Y equals 2/3.

Figure 6:
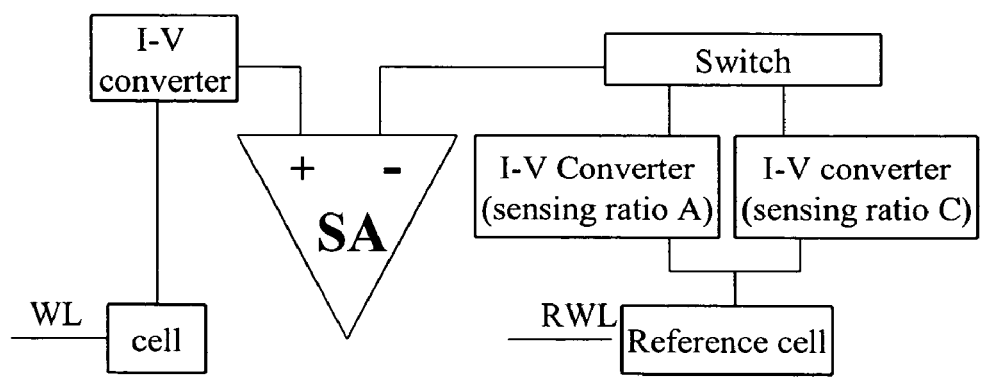
FIGS. 6-8 show schematic diagrams for the sensing ratio at the reference cell side of a flash memory.
Figure 7:
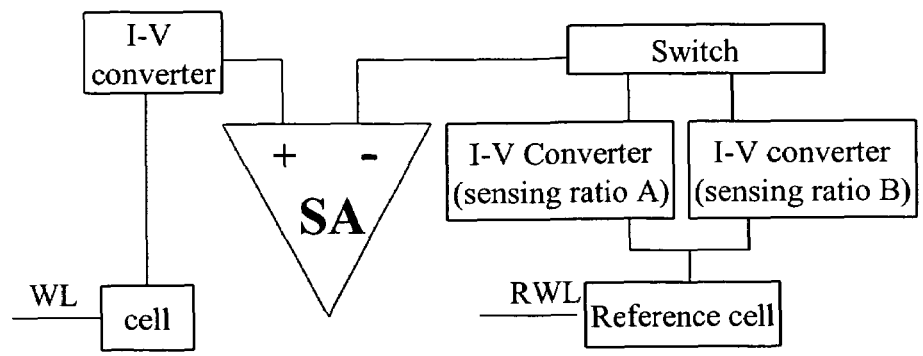
Figure 8:
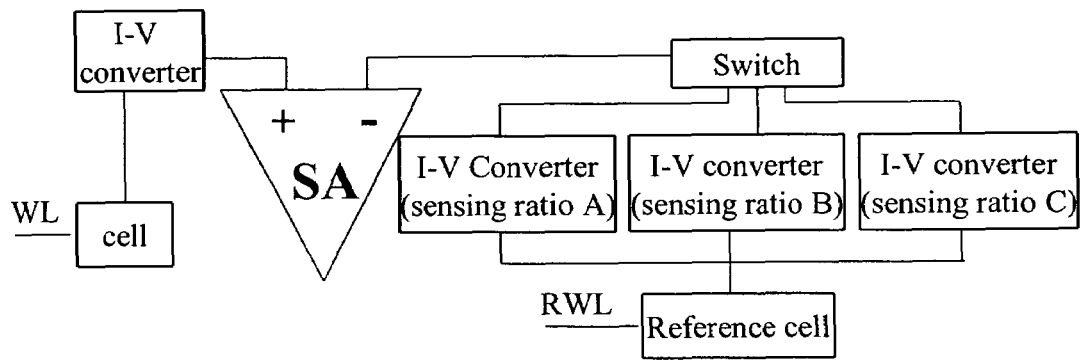

FIGS. 6-8 show the schematic diagrams for the sensing ratio at the reference cell side of the flash memory where FIG. 6 judges the high Vt charge loss cells, FIG. 7 judges the low Vt charge gain cells, and FIG. 8 judges both the high Vt charge loss cells and low Vt charge gain cells.

Figure 9:
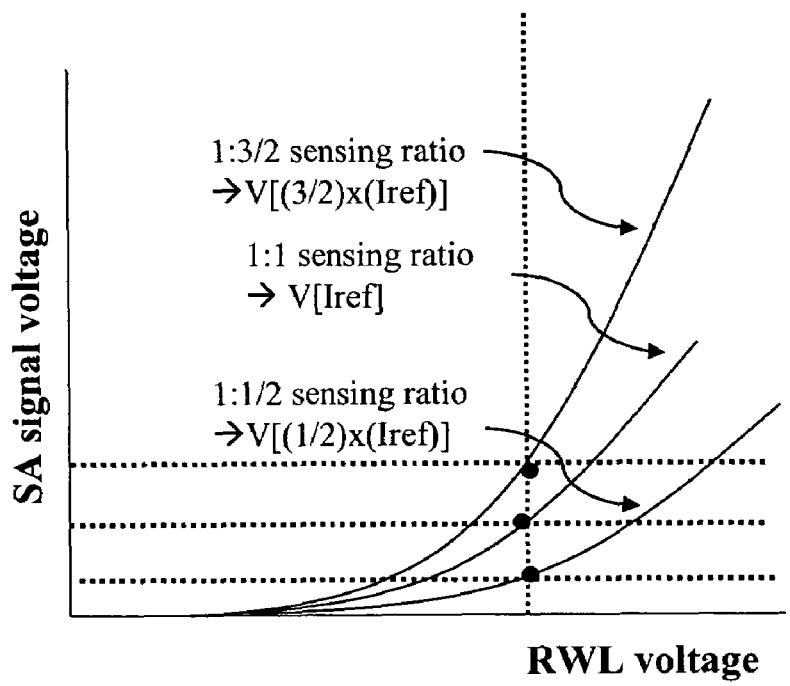
FIG. 9 shows a graph for the SA signal voltage versus RWL voltage for sensing ratios A, B and C of FIGS. 6-8.

FIG. 9 shows the graph for the SA (sense amplifier) signal voltage versus RWL (read wordline) voltage for sensing ratios A, B and C of FIGS. 6-8. For example, the sensing ratio for A is 1:1, B is 1:X (X>1) where X equals 3/2, and C is 1:Y (Y<1) where Y equals 1/2.

Figure 10:
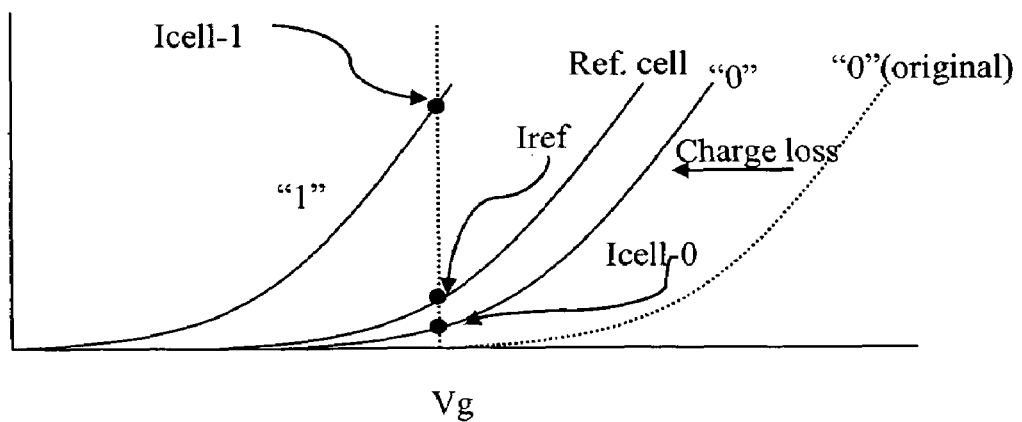
FIG. 10 shows an I-V graph for an SA signal.
Figure 11:
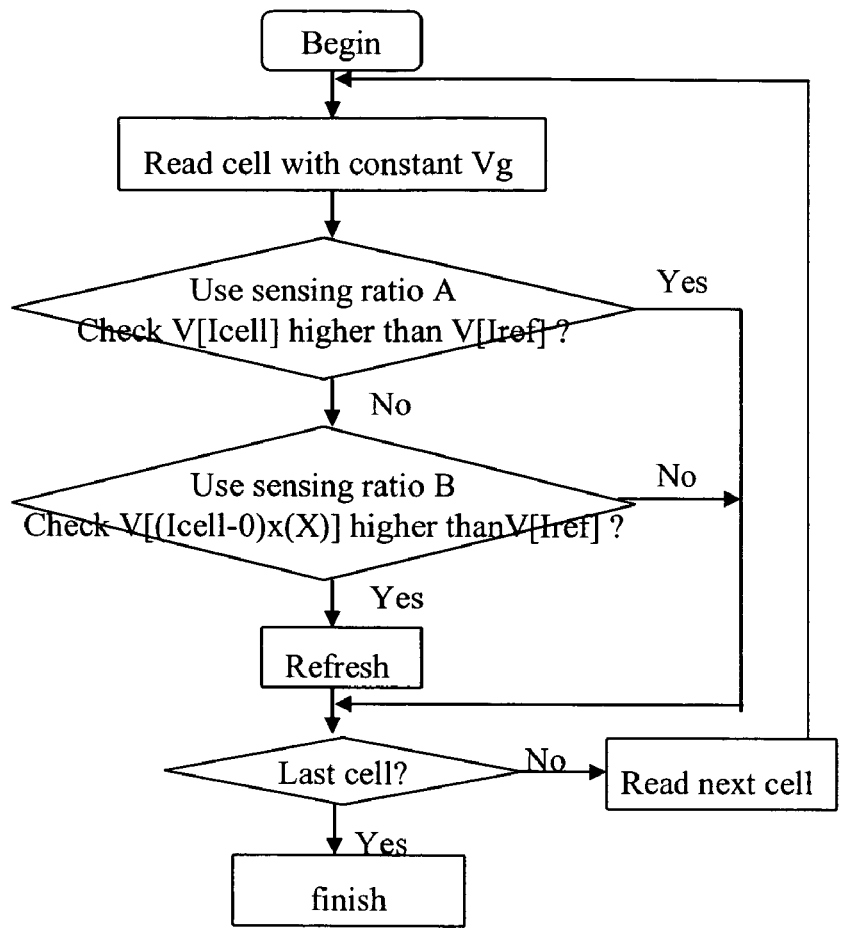
FIG. 11 shows a flow diagram for a sensing ratio for "0" charge loss cells refreshing by using a cell side sensing ratio.

FIG. 10 shows the I-V graph for the SA signal and FIG. 11 shows the flow diagram for the sensing ratio for "0" charge loss cells refreshing by using a cell side sensing ratio. The I-V graph shows transfer characteristic for programmed and initial or erased states. FIG. 11 shows a method that begins by reading the cell using a constant gate voltage, Vg, then it uses sensing ratio A (1:1) to judge the cell for "0"/high Vt or "1"/low Vt, by determining V[Icell-1]>V[Iref]>V[Icell-0]. If it finds V[Icell] is higher than V[Iref], another test determines if this is the last cell. If it is the last cell, the method finishes. If it is not the last cell, it reads the next cell and starts over. However, if V[Icell] is lower than V[Iref], then sensing ratio B (1:X, X>1) judges the cell for "0"/high Vt by determining V[Iref]>V[(Icell-0)×(X)] indicating a normal "0" bit or V[Iref]<V[(Icell-0)×(X)] indicating a charge loss bit, that needs refreshing.

Figure 12:
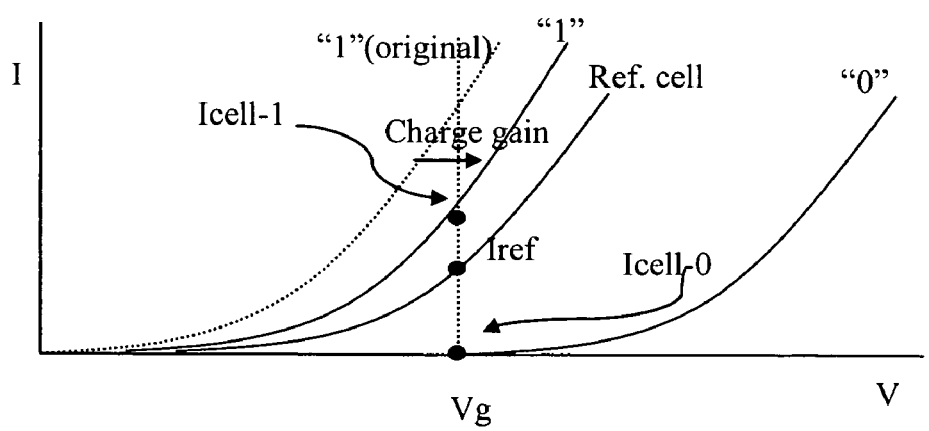
FIG. 12 shows an I-V graph for an SA signal.
Figure 13:
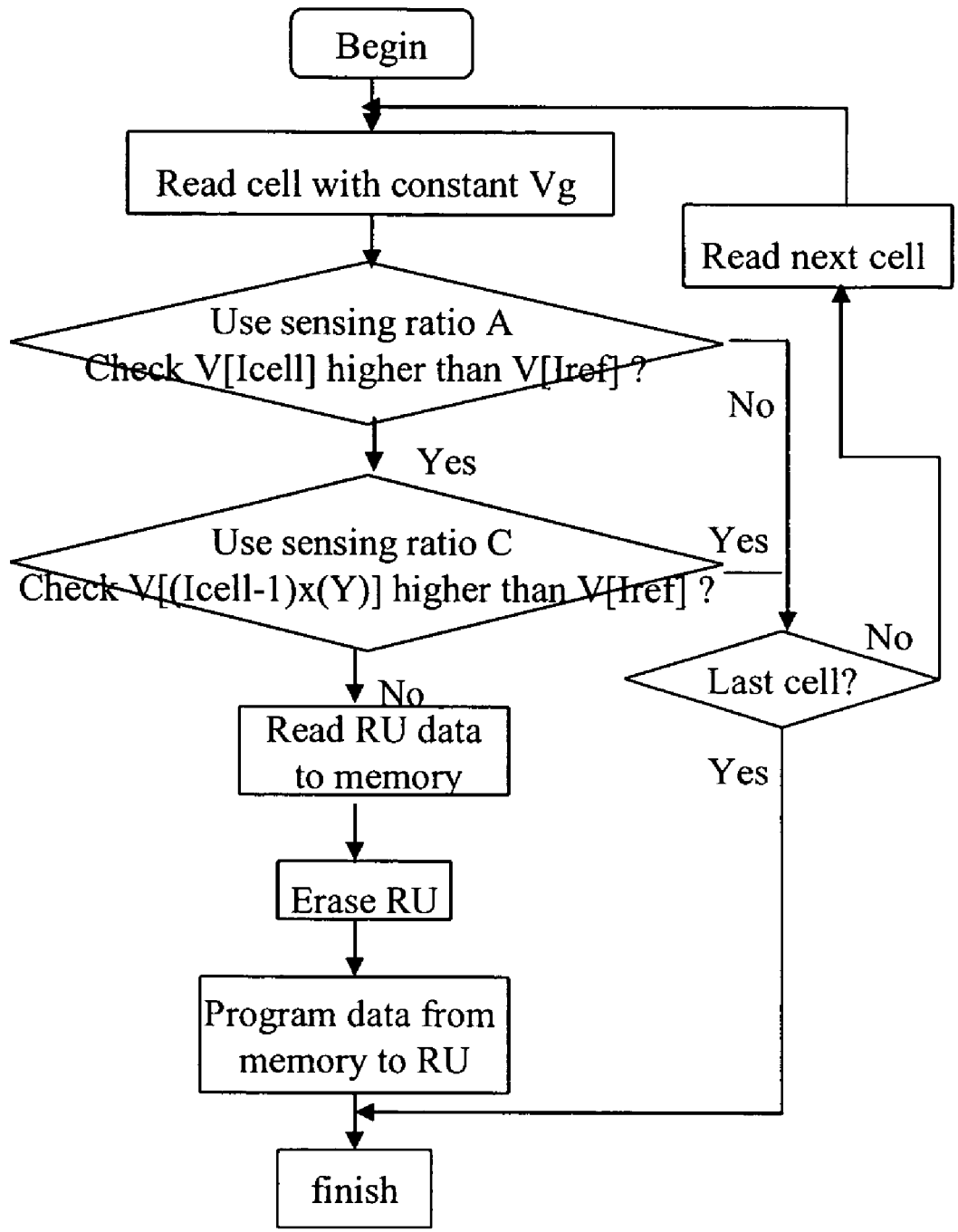
FIG. 13 shows a flow diagram for the sensing ratio for "1" charge gain cells refreshing by using cell side sensing ratio.

FIG. 12 shows the I-V graph for the SA signal and FIG. 13 shows the flow diagram for the sensing ratio for "1" charge gain cells refreshing by using cell side sensing ratio. FIG. 13 shows a method that begins by reading the cell using a constant gate voltage, Vg, then it uses sensing ratio A (1:1) to judge the cell for "0"/high Vt or "1"/low Vt, by determining V[Icell-1]>V[Iref]>V[Icell-0]. If it finds that V[Icell] is lower than V[Iref], another test determines if this is the last cell. If it is the last cell, the method finishes. If it is not the last cell, it reads the next cell and starts over. However, if V[Icell] is higher than V[Iref], then sensing ratio C (1:Y, Y<1) judges the cell for "1"/low Vt by determining V[Iref]<V[(Icell-1)×(Y)] indicating a normal "1" bit or V[Iref]>V[(Icell-1)×(Y)] indicating a charge gain bit, that needs refreshing. If sensing ratio C determines V[(Icell-1)×(Y)] is higher than V[Iref], a test is done to determine if this is the last cell. If it is the last cell, the method finishes. If it is not the last cell, the method starts again for the next cell. However, if sensing ratio C determines V[(Icell-1)×(Y)] is lower than V[Iref], it reads data from the refresh unit (RU) to memory, then it erases the RU, then programs the RU with data from memory and finishes.

Figure 14:
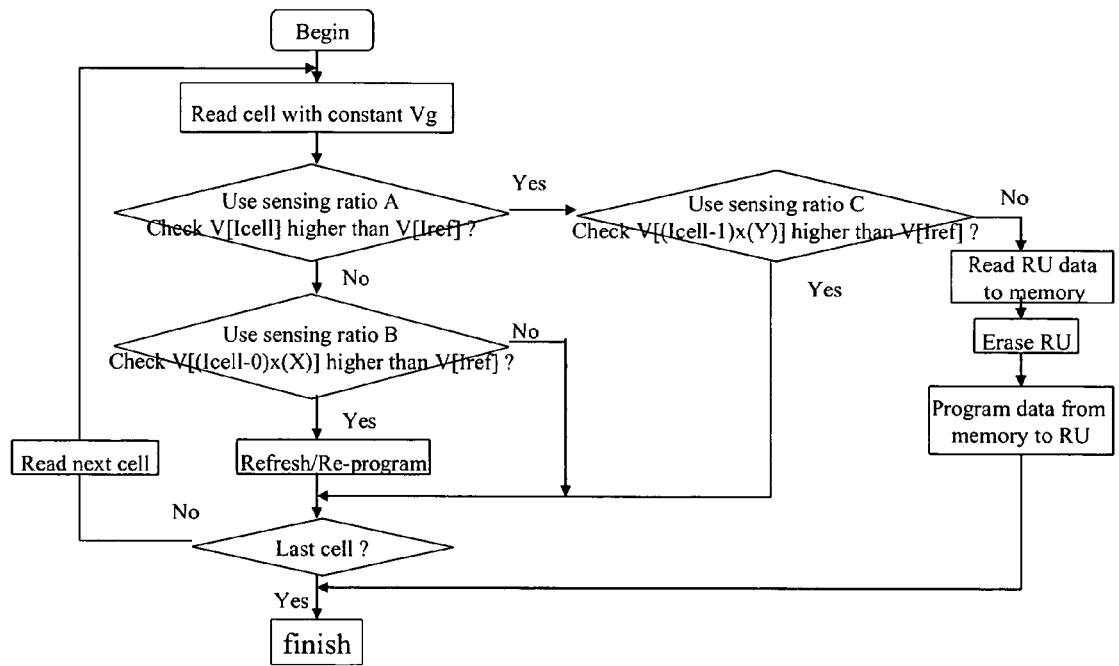
FIG. 14 shows a flow diagram for both "1" charge gain cells and "0" charge loss cells refreshing by using a cell side sensing ratio.

FIG. 14 shows a flow diagram for both "1" charge gain cells and "0" charge loss cells refreshing by using a cell side sensing ratio. The method begins by using a constant gate voltage, Vg, and the sensing ratio A (1:1) judges V[Icell]>V[Iref]. If V[Icell] is lower than V[Iref], then sensing ratio B (1:X, X>1) judges V[(Icell-0)×(X)]>V[Iref]. If V[(Icell-0)×(X)] is lower than V[Iref], another test is done to check if this is the last cell. If it is the last cell, the method finishes. If it is not the last cell, it reads the next cell and the method starts over. However, if V[(Icell-0)×(X)] is greater than V[Iref], it refreshes and reprograms the cell. Then it tests the cell for the last cell.

If the sensing ratio A (1:1) finds V[Icell] is higher than V[Iref], then sensing ratio C (1:Y, Y<1) judges V[(Icell-1)×(Y)]>V[Iref]. If V[(Icell-1)×(Y)] is higher than V[Iref], a test is done to determine if this is the last cell. If it is the last cell, the method finishes. If it is not the last cell, it reads the next cell with a constant gate voltage, Vg, and starts sensing ratio A again. If V[(Icell-1)×(Y)] is lower than V[Iref], it reads data from the refresh unit (RU) to memory, then it erases the RU, then programs the RU with data from memory and finishes.

Figure 15:
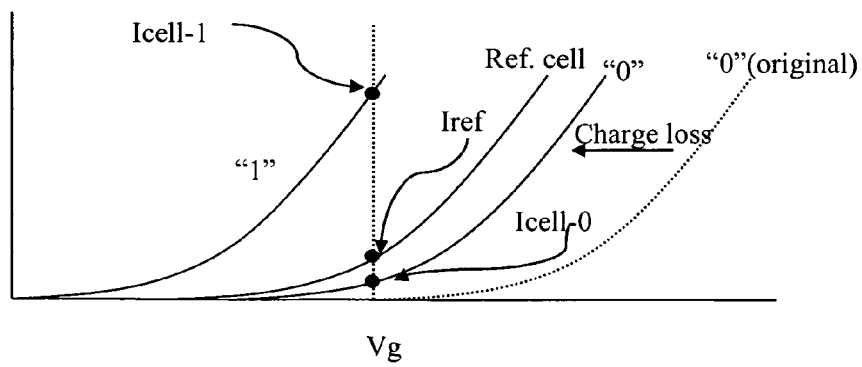
FIG. 15 shows an I-V graph for an SA signal.
Figure 16:
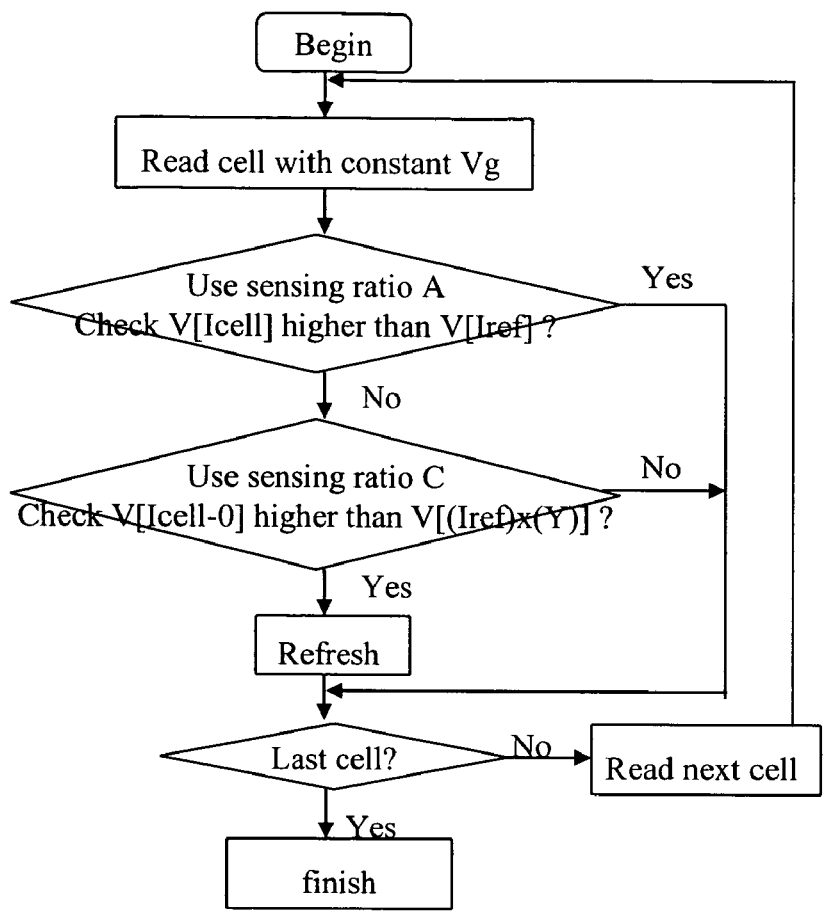
FIG. 16 shows a flow diagram for "0" charge loss cells refreshing by using a reference cell side sensing ratio.

FIG. 15 shows the I-V graph for the SA signal and FIG. 16 shows the flow diagram for the "0" charge loss cells refreshing by using a reference cell side sensing ratio. FIG. 16 shows a method that begins reading the cell by using a constant gate voltage, Vg, then sensing ratio A (1:1) judges the cell for "0"/high Vt or "1 "/low Vt by determining V[Icell-1]>V[Iref]>V[Icell-0]. If V[Icell] is higher than V[Iref], another test determines if this is the last cell. If it is the last cell, the method finishes. If the test finds it is not the last cell, it reads the next cell and starts over. However, if V[Icell] is lower than V[Iref], then sensing ratio C (1:Y, Y<1) judges the cell for "0"/high Vt cell by determining V[(Iref)×(Y)]>V[(Icell-0)] indicating a normal "0" bit or V[(Iref)×(Y)]<V[(Icell-0)] indicating a charge loss bit, that needs refreshing.

Figure 17:
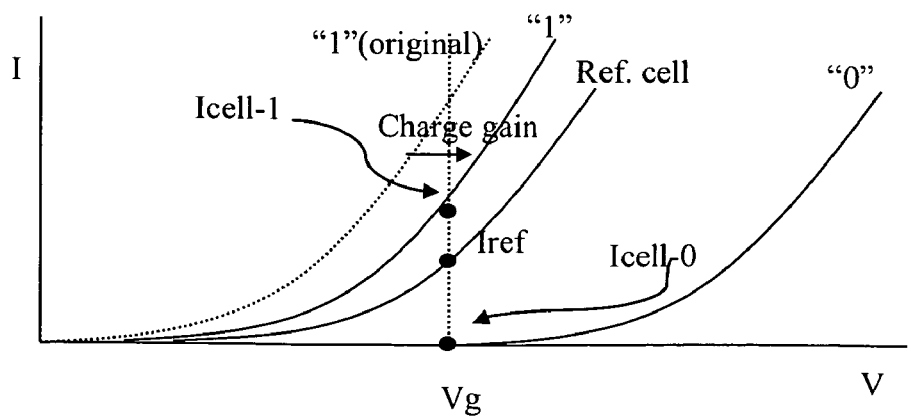
FIG. 17 shows an I-V graph for an SA signal.
Figure 18:
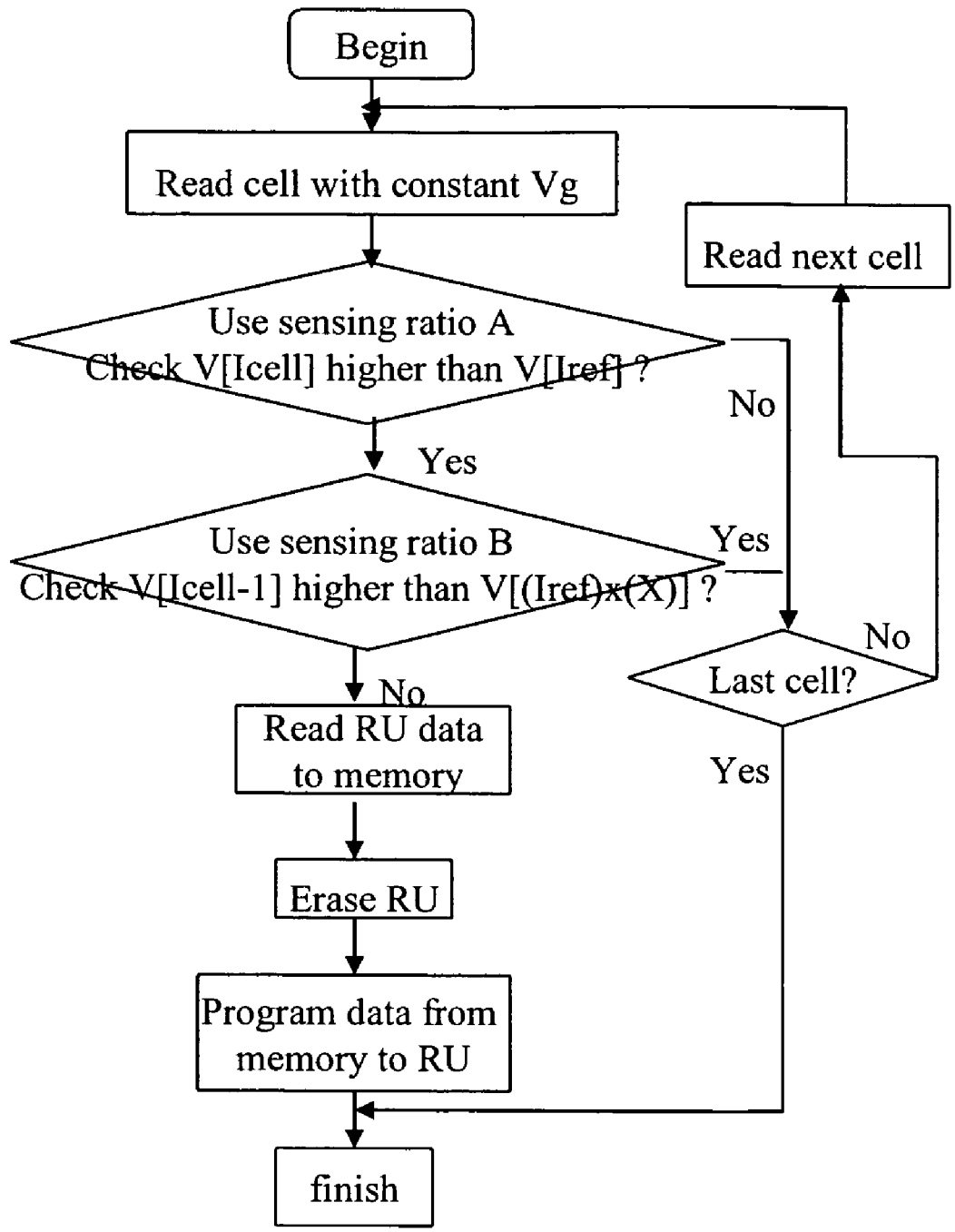
FIG. 18 shows a flow diagram for "1" charge gain cells refreshing by using a reference cell side sensing ratio.

FIG. 17 shows the I-V graph for the SA signal and FIG. 18 shows the flow diagram for the "1" charge gain cells refreshing by using a reference cell side sensing ratio. FIG. 18 shows a method that begins by reading the cell using a constant gate voltage, Vg, then sensing ratio A (1:1) judges the cell for "0"/high Vt or "1"/low Vt by determining V[Icell-1]>V[Iref]>V[Icell-0]. If V[Icell] is lower than V[Iref], another test determines if this is the last cell. If it is the last cell, the method finishes. If it is not the last cell, it reads the next cell and starts over. However, if V[Icell] is higher than V[Iref], then sensing ratio B (1:X, X>1) judges the cell for "1"/low Vt cell, by determining V[(Iref)×(X)]<V[(Icell-1)] indicating a normal "1" bit or V[(Iref)×(X)]>V[(Icell-1)] indicating a charge gain bit, that needs refreshing. If sensing ratio B determines V[(Icell-1)] is higher than V[(Iref)×(X)], a test is done to determine if this is the last cell. If it is the last cell, the method finishes. If it is not the last cell, the method starts again for the next cell. However, if sensing ratio B determines V[(Icell-1)] is lower than V[(Iref)×(X)], it reads the data from the refresh unit (RU) to memory, then it erases the RU and programs the RU with data from memory then finishes.

Figure 19:
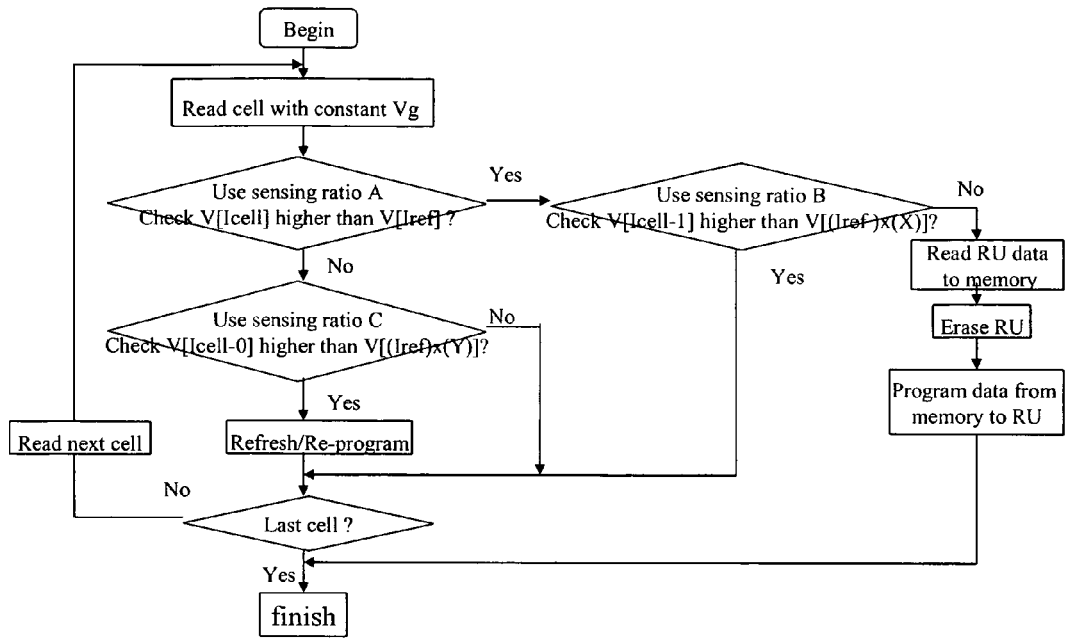
FIG. 19 show a flow diagram for both "1" charge gain cells and "0" charge loss cells refreshing using a reference cell side sensing ratio.

FIG. 19 show a flow diagram for both "1" charge gain cells and "0" charge loss cells refreshing using the reference cell side sensing ratio. The method begins by using a constant gate voltage, Vg. Next sensing ratio A (1:1) judges V[Icell]>V[Iref]. If V[Icell] is lower than V[Iref], then sensing ratio C (1:Y, Y<1) judges V[(Icell-0)]>V[(Iref)×(Y)]. If V[(Icell-0)] is lower than V[(Iref)×(Y)], another test is done to check if this is the last cell. If it is the last cell, the method finishes. If it is not the last cell, it reads the next cell and the method starts over. However, if V[(Icell-0)] is greater than V[Iref], then the algorithm refreshes and reprograms the cell. Then it tests this cell for the last cell.

If the sensing ratio A (1:1) finds V[Icell] is higher than V[Iref], then sensing ratio B (1:X, X>1) judges V[(Icell-1)]>V[(Iref)×(X)]. If V[(Icell-1)] is higher than V[(Iref)×(X)], a test determines if this is the last cell. If it is the last cell, the method finishes. If V[(Icell-1)] is lower than V[(Iref)×(X)], it reads data from the refresh unit (RU) to memory, then it erases the RU and programs the RU with data from memory then finishes.

Figure 20:
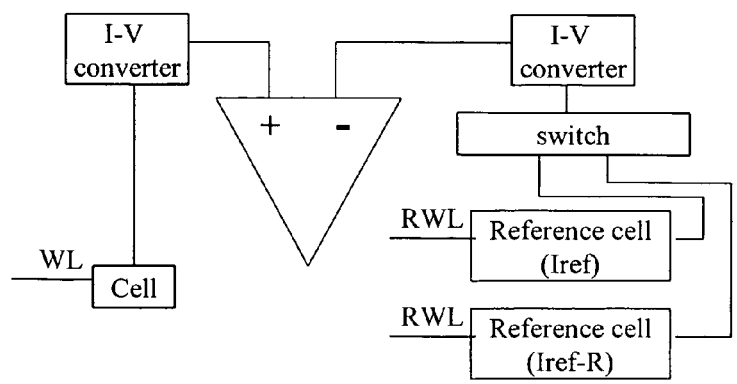
FIGS. 20-22 show the sensing ratio at a reference cell side of a flash memory.
Figure 21:
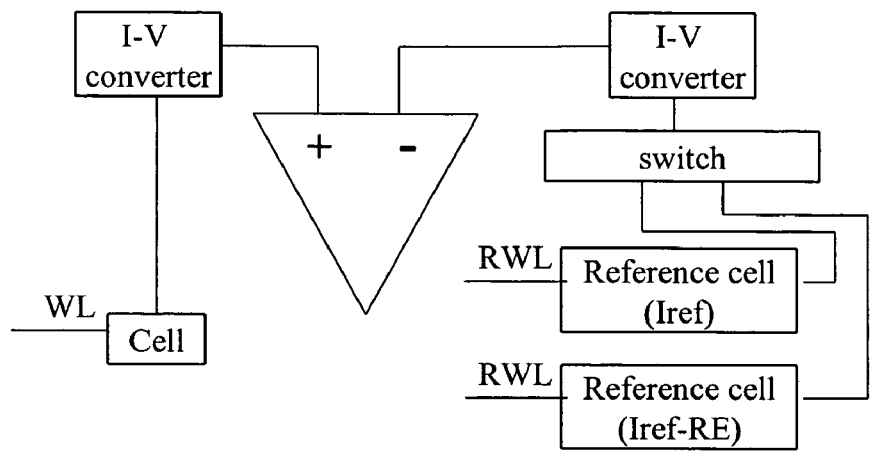
Figure 22:
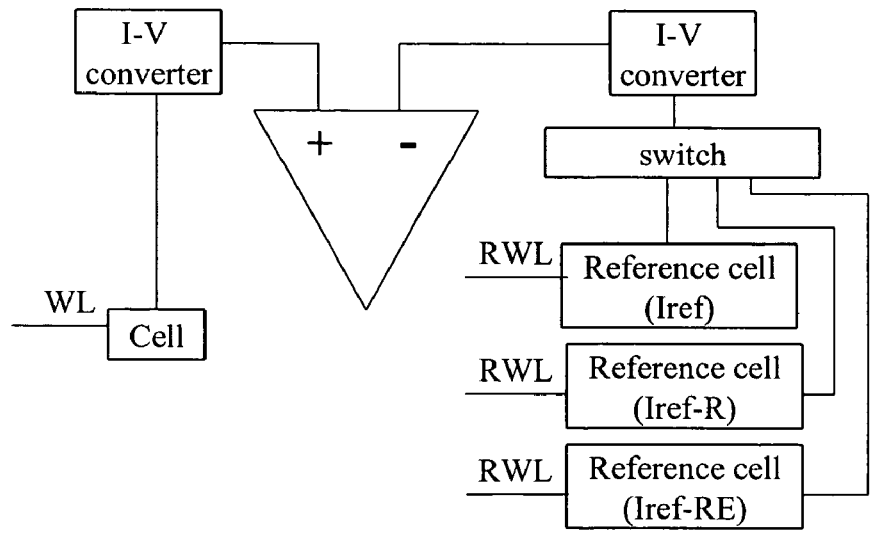

FIGS. 20-22 show the sensing ratio at the reference cell side of the flash memory, where FIG. 20 judges the high Vt charge loss cells, FIG. 21 judges the low Vt charge gain cells and FIG. 22 judges both high Vt charge loss cells and low voltage charge gain cells. FIGS. 20-22 show I-V converters that directly convert the cell current to a voltage.

Figure 23:
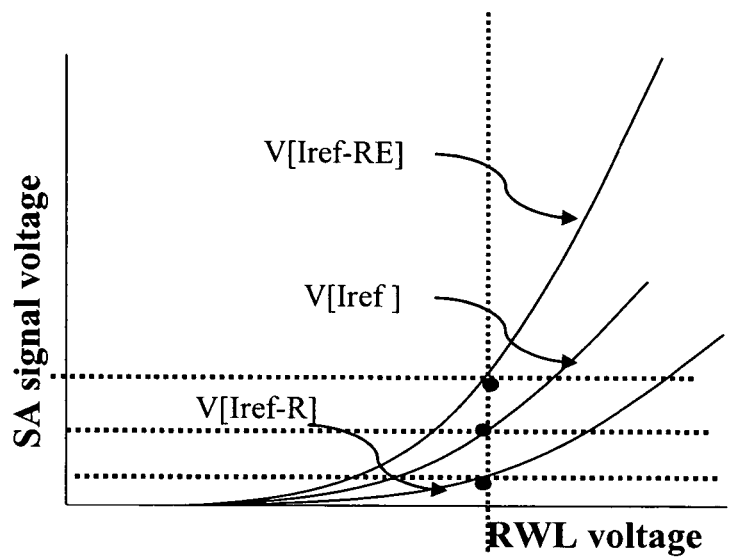
FIG. 23 shows a graph for an SA signal voltage versus RWL voltage for sensing ratios A, B and C of FIGS. 20-22.

FIG. 23 shows a graph for the SA signal voltage versus the RWL voltage for sensing ratios A, B and C for FIGS. 20-22. For example, Iref-RE=(3/2)×(Iref) and Iref-R=(1/2)×(Iref).

Figure 24:
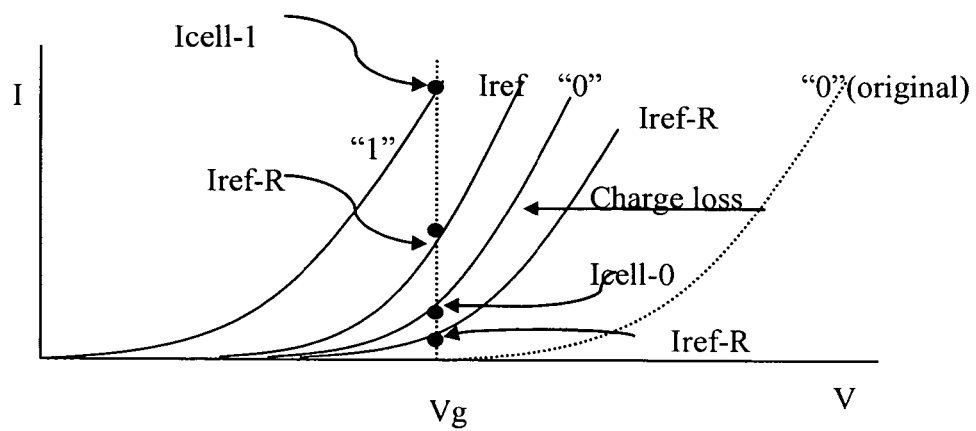
FIG. 24 shows an I-V graph for an SA signal.
Figure 25:
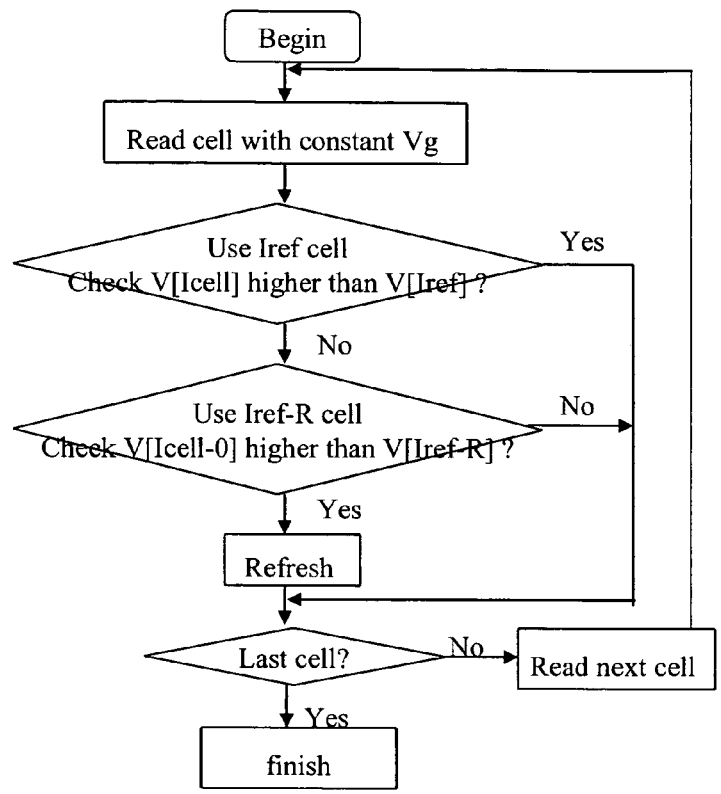
FIG. 25 shows a flow diagram for a reference cell for "0" charge loss cell refreshing.

FIG. 24 shows the I-V graph for the SA signal and FIG. 25 shows the flow diagram for the reference cell for "0" charge loss cell refreshing. The flow diagram in FIG. 25, shows the method begins by reading the cell using a constant gate voltage, Vg, then the Iref cell judges the cell for "0"/high Vt or "1"/low Vt by determining V[Icell-1]>V[Iref]>V[Icell-0]. If V[Icell] is higher than V[Iref], then another test determines if this is the last cell. If it is the last cell, the method finishes. If the test determines it is not the last cell, it reads the next cell and starts over. However, if V[Icell] is lower than V[Iref], then Iref-R cell judges the cell for "0"/high Vt cells by determining V[Iref-R]>V[(Icell-0)] indicating a normal "0" bit or V[Iref-R]<V[(Icell-0)] indicating a charge loss bit, that needs refreshing. FIGS. 20-22 show I-V converters that directly convert the cell current to a voltage.

Figure 26:
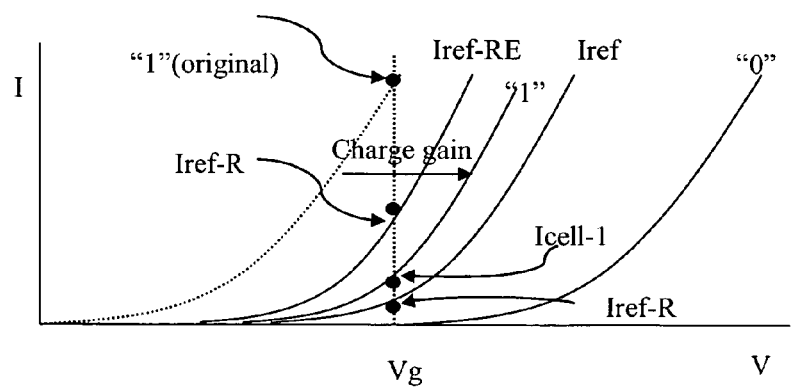
FIG. 26 shows an I-V graph for an SA signal.
Figure 27:
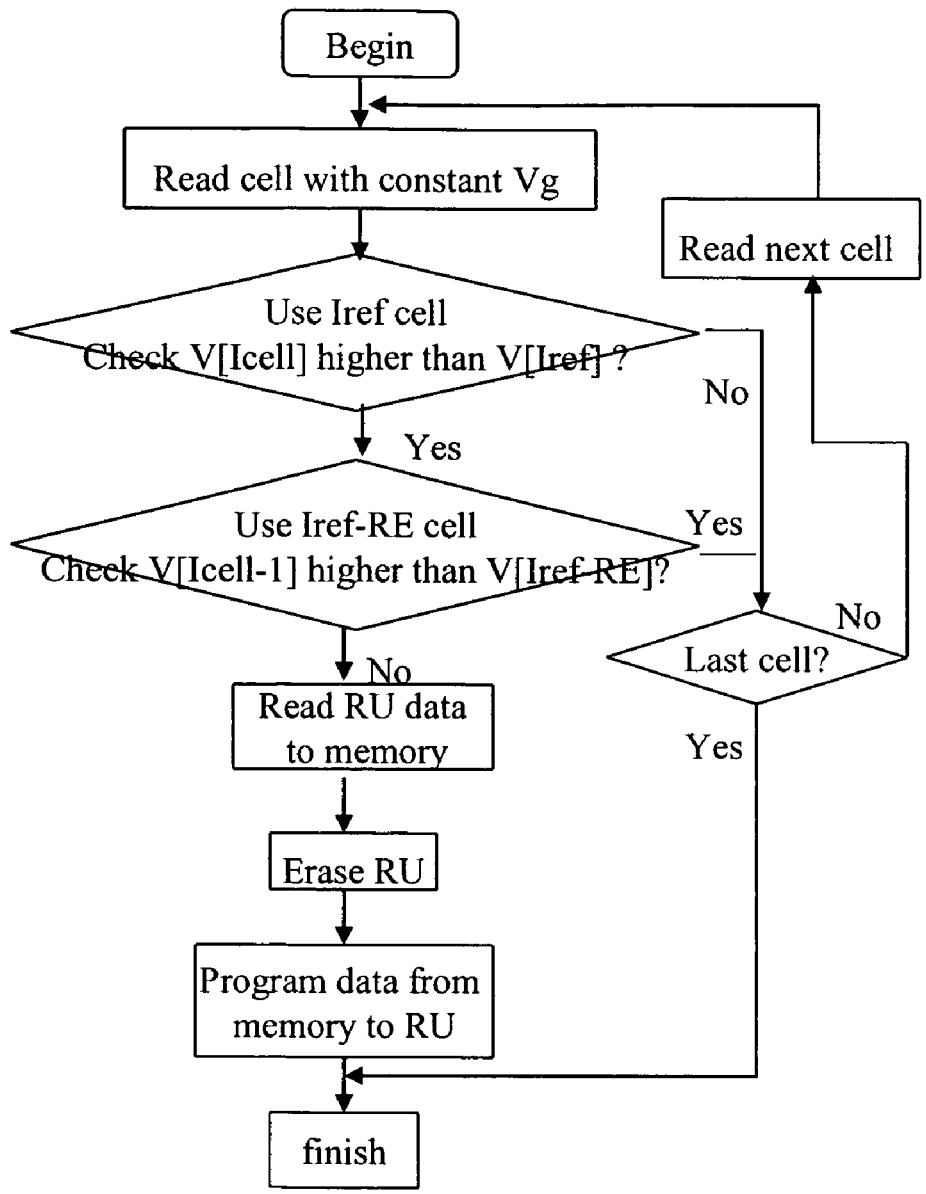
FIG. 27 shows a flow diagram for "1" charge gain cells refreshing.

FIG. 26 shows the I-V graph for the SA signal and FIG. 27 shows the flow diagram for "1" charge gain cells refreshing. The flow diagram in FIG. 27, shows the method begins by reading the cell using a constant gate voltage, Vg, then the Iref cell judges the cell for "0"/high Vt or "1"/low Vt by determining V[Icell-1]>V[Iref]>V[Icell-0]. If V[Icell] is lower than V[Iref], another test determines if this is the last cell. If it is the last cell, the method finishes. If it is not the last cell, it reads the next cell and starts over. However, if V[Icell] is higher than V[Iref], then Iref-RE cell judges the cell for "1"/low Vt cell by determining V[Iref-RE]<V[(Icell-1)] indicating a normal "1" bit or V[Iref-RE]>V[(Icell-1)] indicating a charge gain bit, that needs refreshing. If Iref-RE cell determines V[(Icell-1)] is higher than V[Iref-RE], a test determines if this is the last cell. If it is the last cell, the method finishes. If it is not the last cell, the method starts again for the next cell. However, if Iref-RE cell determines V[(Icell-1)] is lower than V[Iref-RE], it reads the data from the refresh unit (RU) to memory, then it erases the RU and programs the RU with data from memory then finishes.

Figure 28:
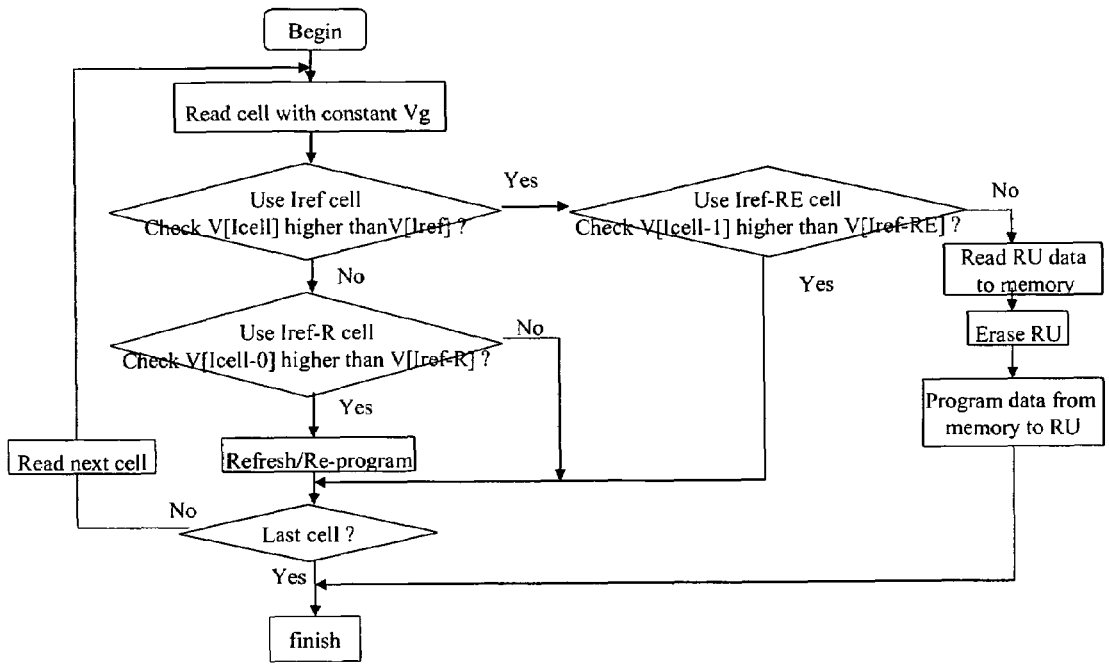
FIG. 28 shows a flow diagram for a reference cell for both "1" charge gain cell and "0" charge loss cell refreshing.

FIG. 28 shows a flow diagram for a reference cell for both "1" charge gain cell and "0" charge loss cell refreshing. The method begins by using a constant gate voltage, Vg, then the Iref cell judges V[Icell]>V[Iref]. If V[Icell] is lower than V[Iref], then Iref-R cell judges V[(Icell-0)]>V[Iref-R]. If V[(Icell-0)] is lower than V[Iref-R], another test determines if this is the last cell. If it is the last cell, the method finishes. If it is not the last cell, it reads the next cell and the method starts over. However if V[(Icell-0)] is greater than V[Iref-R], the algorithm refreshes and reprograms the cell. Then it tests the cell for the last cell.

If V[Icell] is higher than V[Iref], then Iref-RE cell judges V[(Icell-1)]>V[Iref-RE]. If V[(Icell-1)] is higher than V[Iref-RE], a test determines if this is the last cell. If it is the last cell, the method finishes. If V[(Icell-1)] is lower than V[Iref-RE], it reads the data from the refresh unit (RU) to memory, then it erases the RU and programs the RU with data from memory then finishes.

Figure 29:
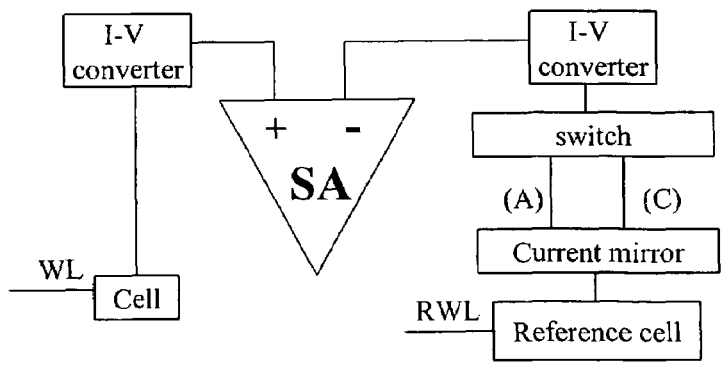
FIGS. 29-32 show schematic diagrams for current mirrors at a reference cell side of a flash memory.
Figure 30:
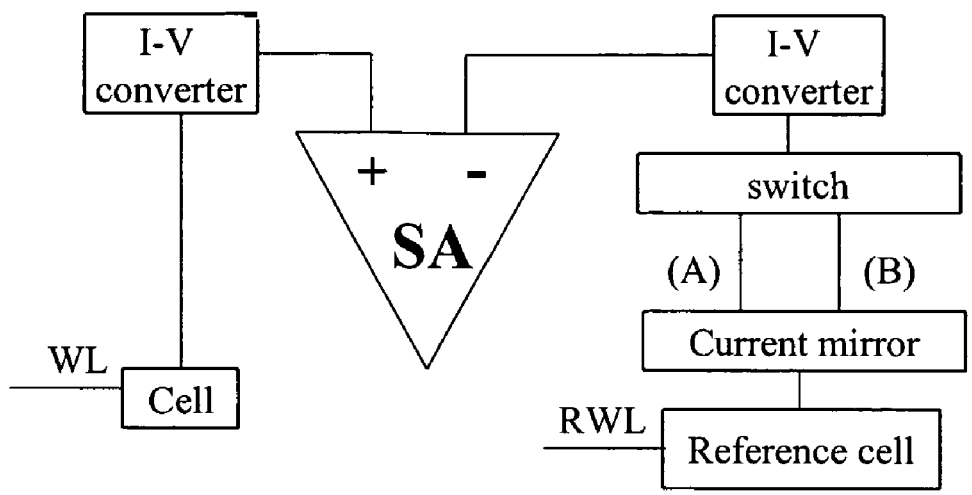
Figure 31:
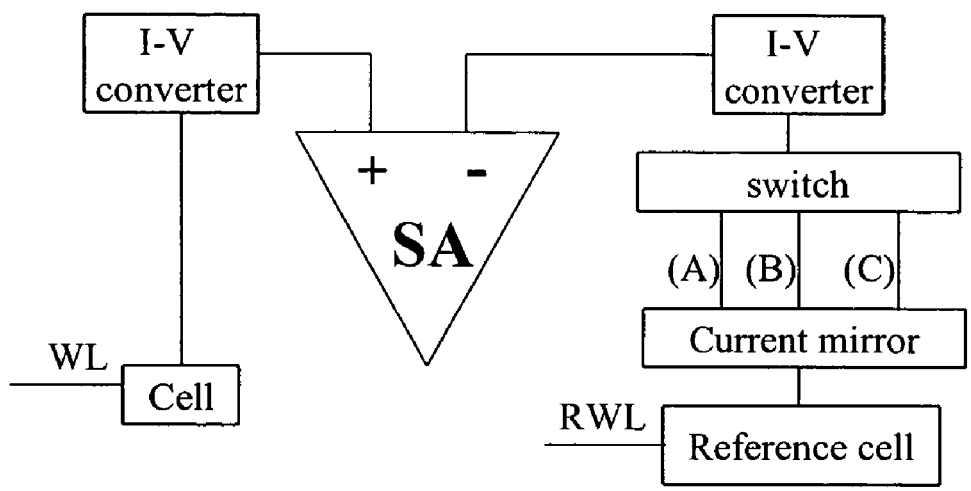

FIGS. 29-32 show schematic diagrams for current mirrors at the reference cell side of the flash memory where FIG. 29 judges the high Vt charge loss cell, FIG. 30 judges the low Vt charge gain cell and FIG. 31 judges both high Vt charge loss cell and low Vt charge gain cell.

Figure 32:
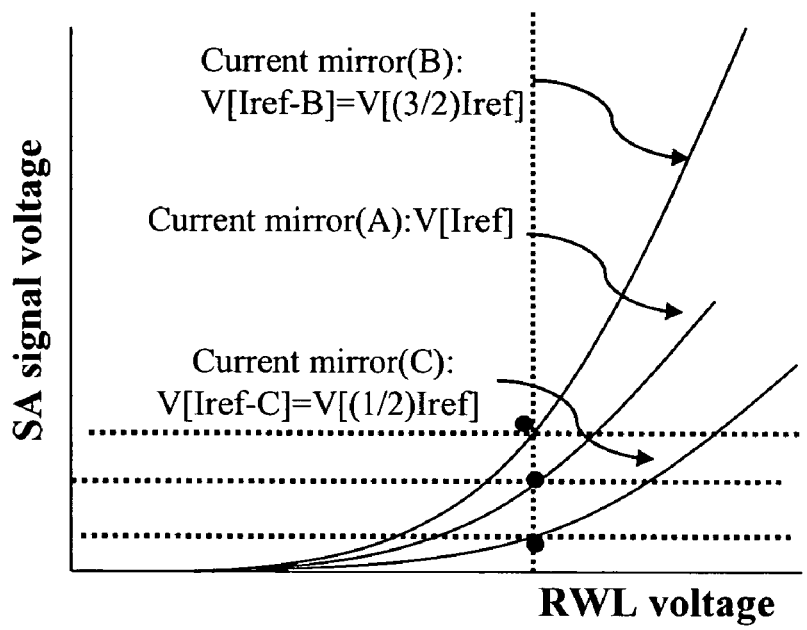

FIG. 32 shows a graph for the SA signal voltage versus the RWL voltage for current mirrors A, B and C for FIGS. 29-31. For example, the reference current is Iref, and if X=3/2, Iref-B=(3/2)×(Iref) and if Y=1/2, Iref-C=(1/2)×(Iref).

Figure 33:
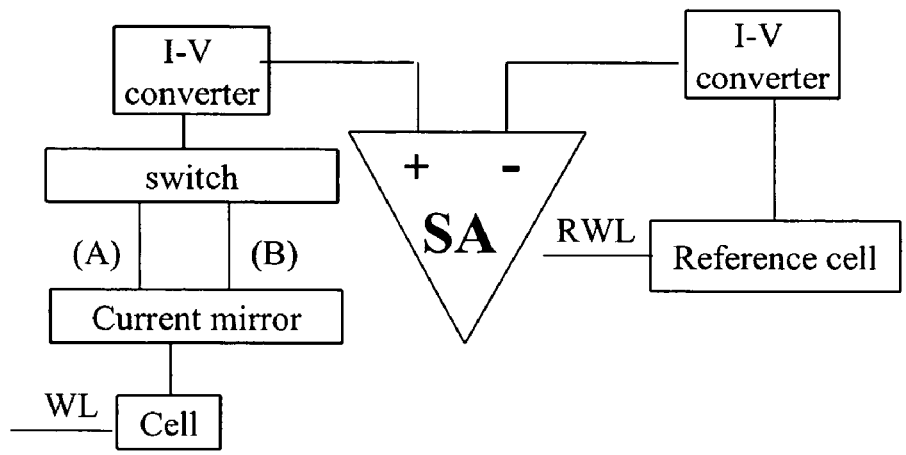
FIGS. 33-36 show a current mirror at a cell side of a flash memory.
Figure 34:
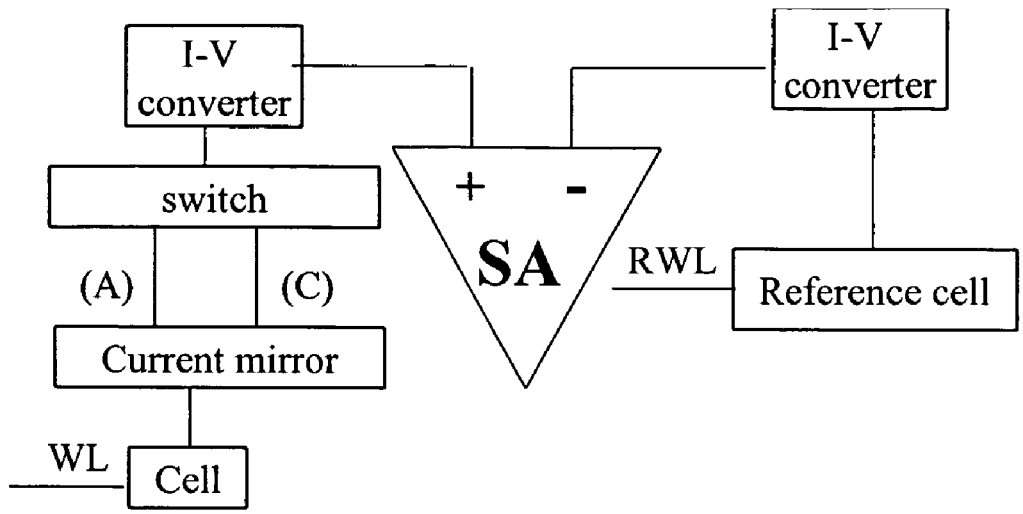
Figure 35:
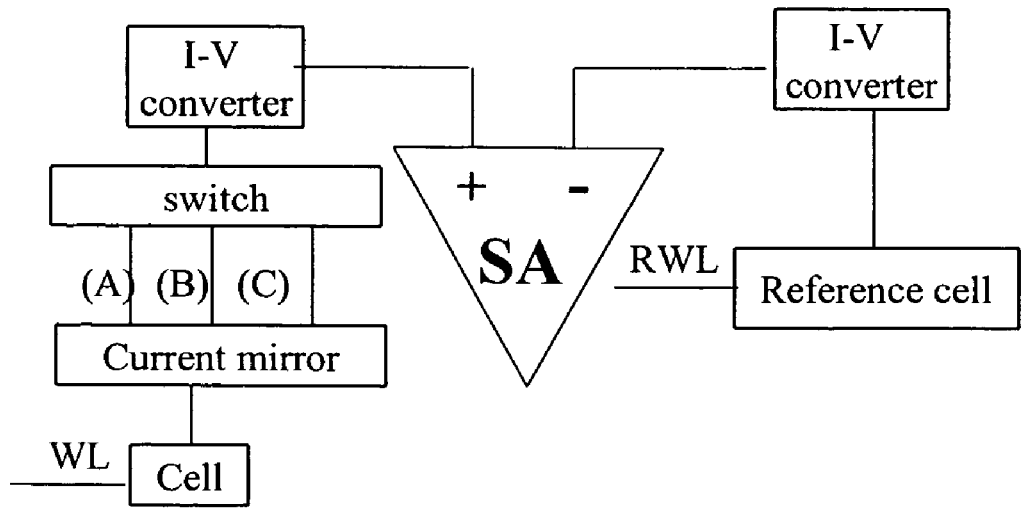

FIGS. 33-36 show the current mirror at the cell side of the flash memory where FIG. 33 judges the high Vt charge loss cell, FIG. 34 judges the low Vt charge gain cell and FIG. 35 judges both high Vt charge loss cell and low voltage charge gain cell.

Figure 36:
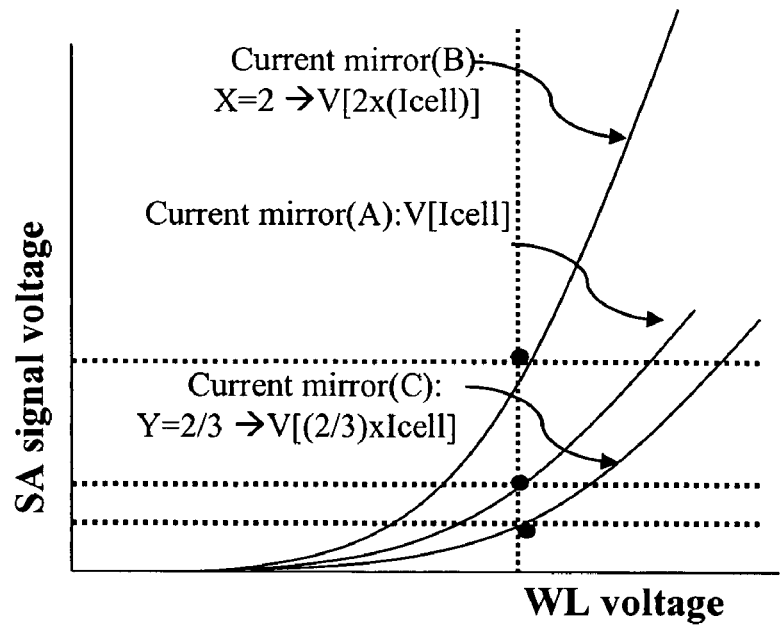

FIG. 36 shows a graph for the SA signal voltage versus the WL voltage for current mirrors A, B and C of FIGS. 33-35. For example, the cell current is Icell, if X=2, cell current=2×(Icell) and if Y=2/3, cell current=(2/3)×(Icell).

Figure 37:
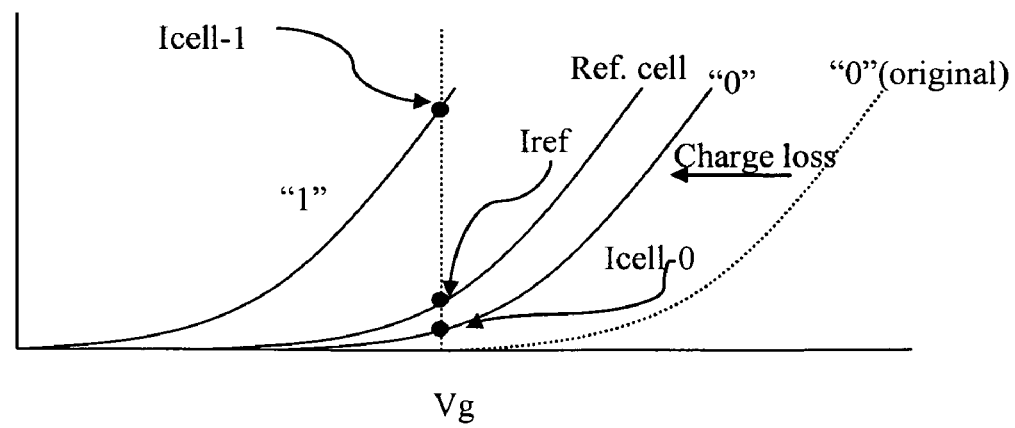
FIG. 37 shows an I-V graph for an SA signal.
Figure 38:
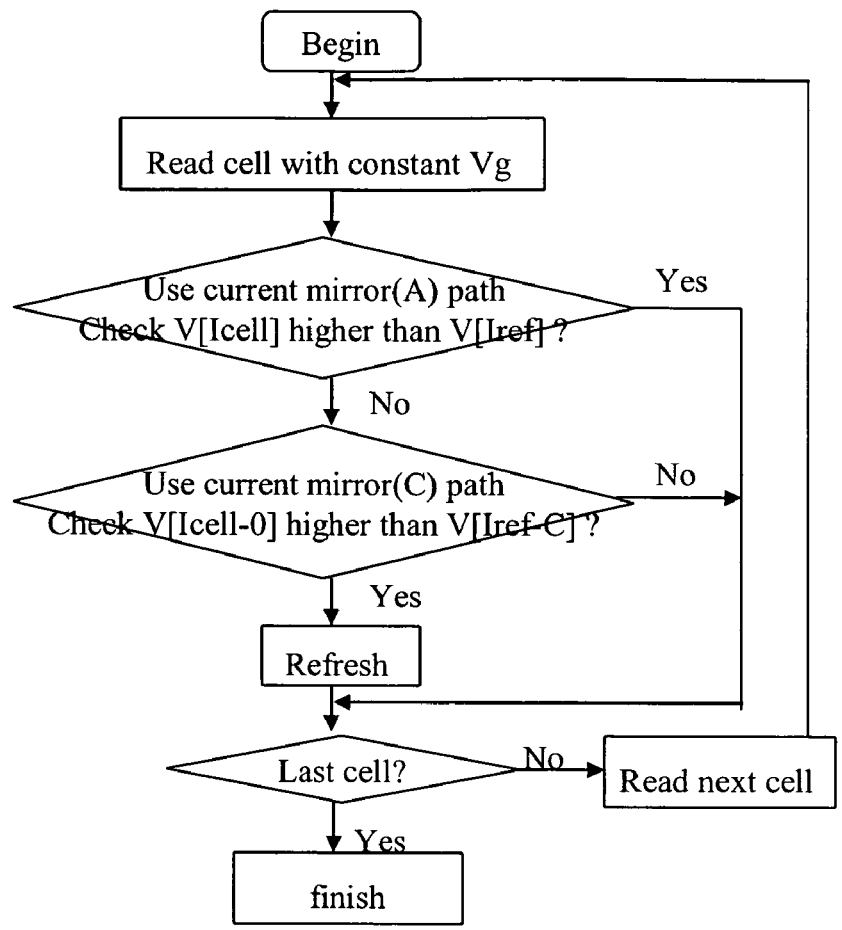
FIG. 38 shows a flow diagram for "0" charge loss cell refreshing and using a current mirror on a reference cell side.

FIG. 37 shows the I-V graph for the SA signal and FIG. 38 shows the flow diagram for "0" charge loss cell refreshing and using a current mirror on the reference cell side. FIG. 38 begins by reading the cell by using a constant gate voltage, Vg, then current mirror A judges the cell for "0"/high Vt or "1"/low Vt by determining V[Icell-1]>V[Iref]>V[Icell-0]. If V[Icell] is higher than V[Iref], another test determines if this is the last cell. If it is the last cell, the method finishes. If the test determines it is not the last cell, it reads the next cell and starts over. However, V[Icell] is lower than V[Iref], then current mirror C judges the cell to determine the "0"/high Vt cell by determining V[Iref-C]=V[(Iref)×(Y)]>V[Icell-0] indicating a normal "0" bit or V[Iref-C]=V[(Iref)×(Y)]<V[Icell-0] indicating a charge loss bit, that needs refreshing. For example, current mirror A uses Iref and for Y=1/2, current mirror C reference current equals Iref-C=(1/2)×Iref.

Figure 39:
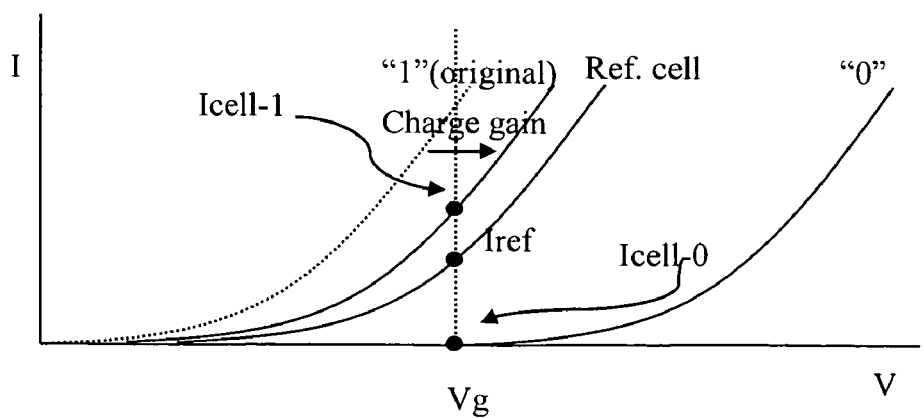
FIG. 39 shows an I-V graph for an SA signal.
Figure 40:
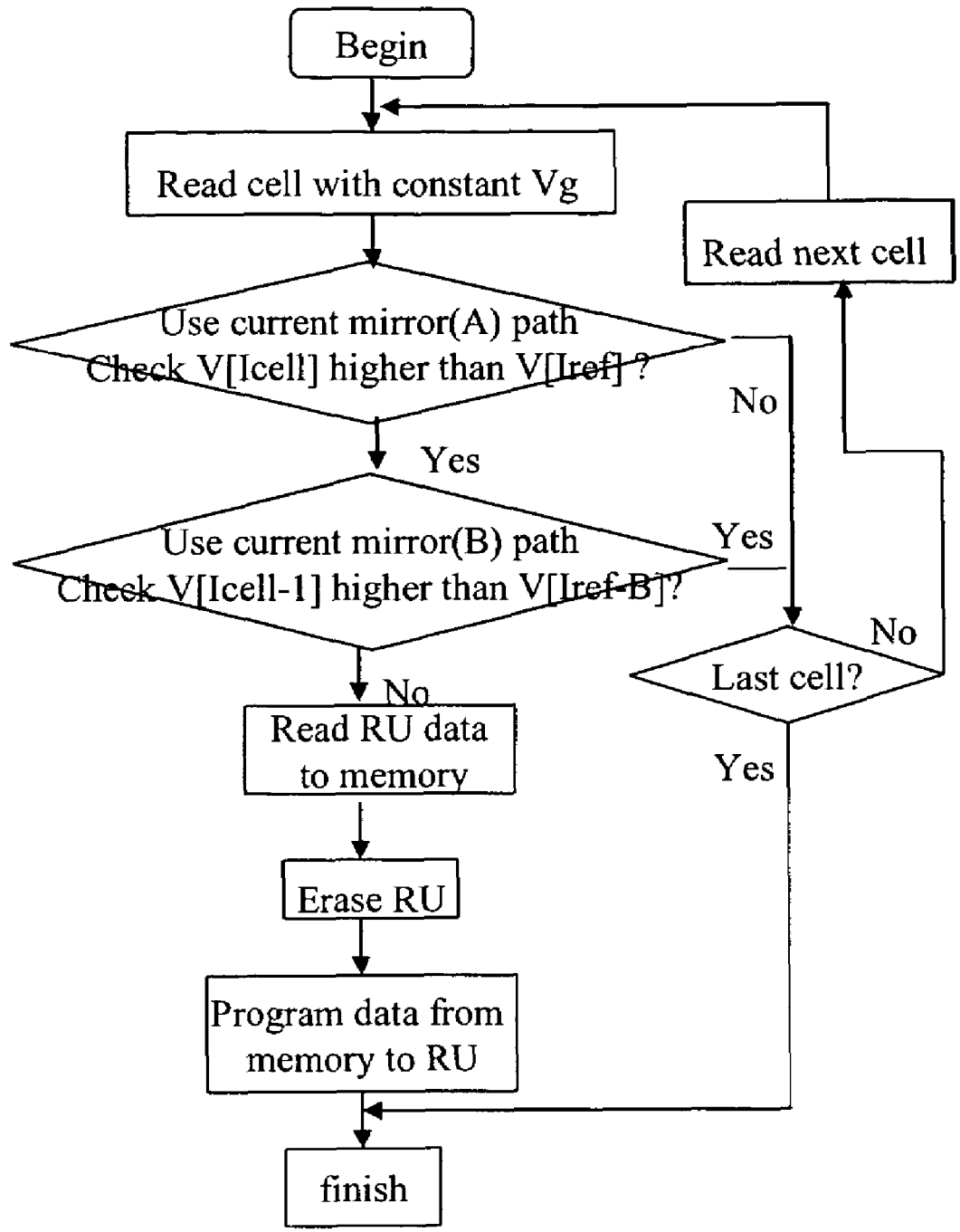
FIG. 40 shows a flow diagram for "1" charge gain cell refreshing using a current mirror at a reference cell side.

FIG. 39 shows the I-V graph for the SA signal and FIG. 40 shows the flow diagram for "1" charge gain cell refreshing using a current mirror at reference cell side. FIG. 40 shows a method that begins by reading the cell using a constant gate voltage, Vg, then current mirror A judges the cell for "0"/high Vt or "1"/low Vt by determining V[Icell-1]>V[Iref]>V[Icell-0]. If V[Icell] is lower than V[Iref], another test determines if this is the last cell. If it is the last cell, the method finishes. If it is not the last cell, it reads the next cell and starts over. However, if V[Icell] is higher than V[Iref], then current mirror B judges the cell for "1"/low Vt cell by determining V[Iref-B]=V[(Iref)×(X)]<V[Icell-1] indicating a normal "1" bit or V[Iref-B]=V[(Iref)×(X)]>V[Icell-1] indicating a charge gain bit, that needs refreshing. If current mirror B determines V[(Icell-1)] is higher than V[Iref-B], a test determines if this is the last cell. If it is the last cell, the method finishes. If it is not the last cell, the method starts over for the next cell. However, if V[(Icell-1)] is lower than V[Iref-B], it reads the data from the refresh unit (RU) to memory, then it erases the RU and programs the RU with data from memory then finishes.

Figure 41:
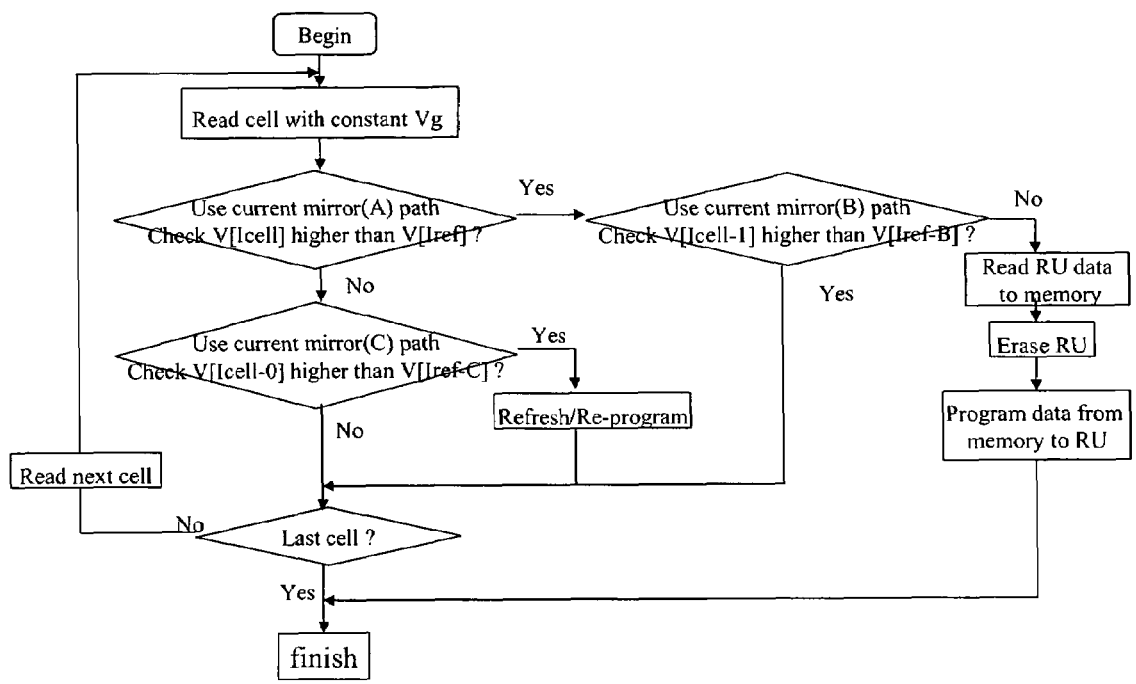
FIG. 41 shows a flow diagram for both "1" charge gain cell and "0" charge loss cell refresh using a current mirror at the reference cell side.

FIG. 41 shows a flow diagram for both "1" charge gain cell and "0" charge loss cell refresh using a current mirror at the reference cell side. The method begins by using a constant gate voltage, Vg, then current mirror A judges V[Icell]>V[Iref]. If V[Icell] is lower than V[Iref], then current mirror C judges V[(Icell-0)]>V[Iref-C]. If V[(Icell-0)] is lower than V[Iref-C], another test determines if this is the last cell. If it is the last cell, the method finishes. If it is not the last cell, it reads the next cell and the method starts over. However if V[(Icell-0)] is greater than V[Iref-C], it refreshes and reprograms the cell. Then it tests the cell for the last cell.

If V[Icell] is higher than V[Iref], then current mirror B judges V[(Icell-1)]>V[Iref-B]. If V[(Icell-1)] is higher than V[Iref-B], a test determines if this is the last cell. If it is the last cell, the method finishes. If V[(Icell-1)] is lower than V[Iref-B], it reads the data from the refresh unit (RU) to memory, then it erases the RU and programs the RU with data from memory then finishes.

Figure 42:
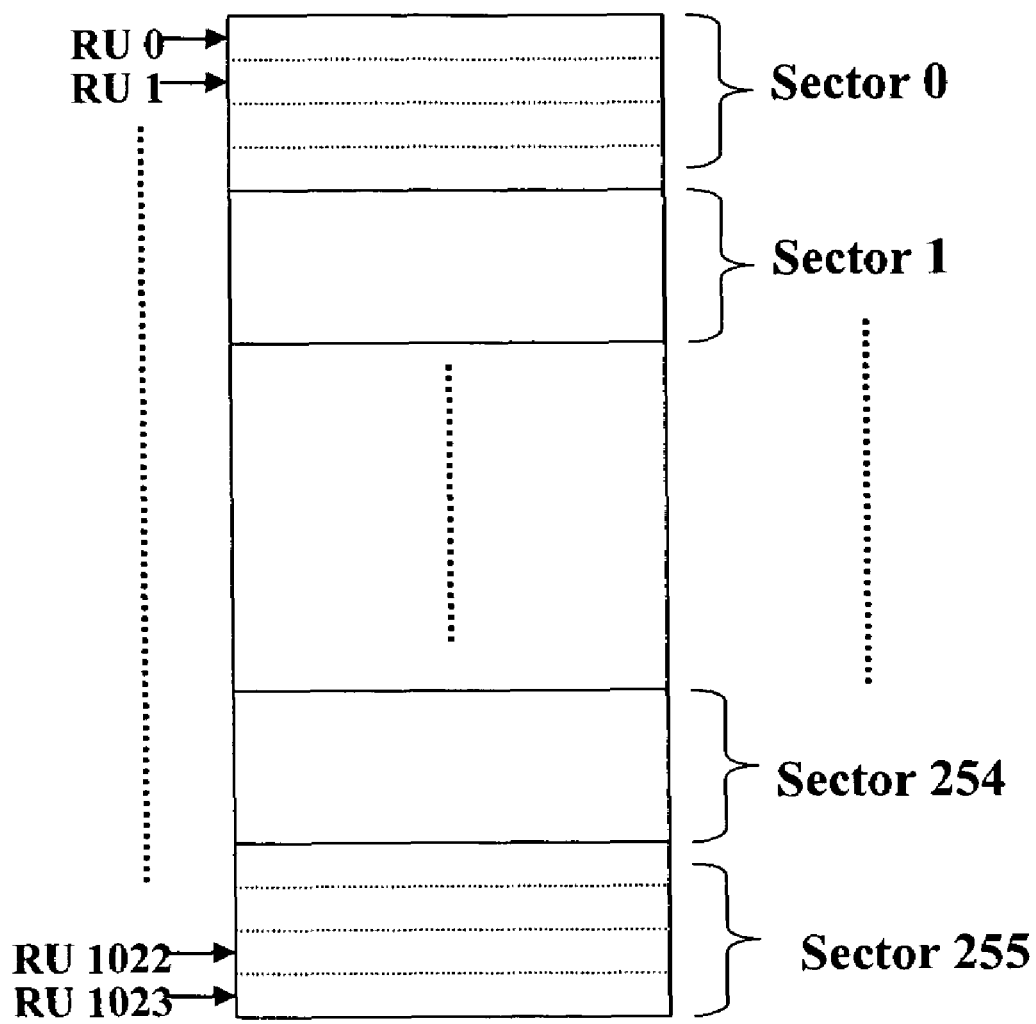
FIG. 42 shows a sector mapping of a flash memory.
Figure 42:
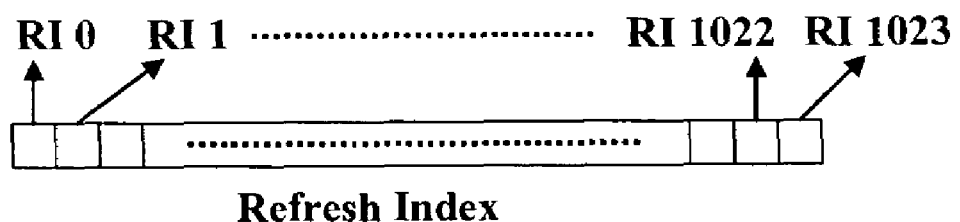

FIG. 42 shows a sector mapping of a flash memory containing 256 sectors having 1 Mbits per sector. It shows that each sector contains four refresh units (RU) and each RU has a corresponding refresh index (RI). For each operation, whether it is sector erase, power on or sleep mode, the refresh method is an embedded function.

Figure 43:
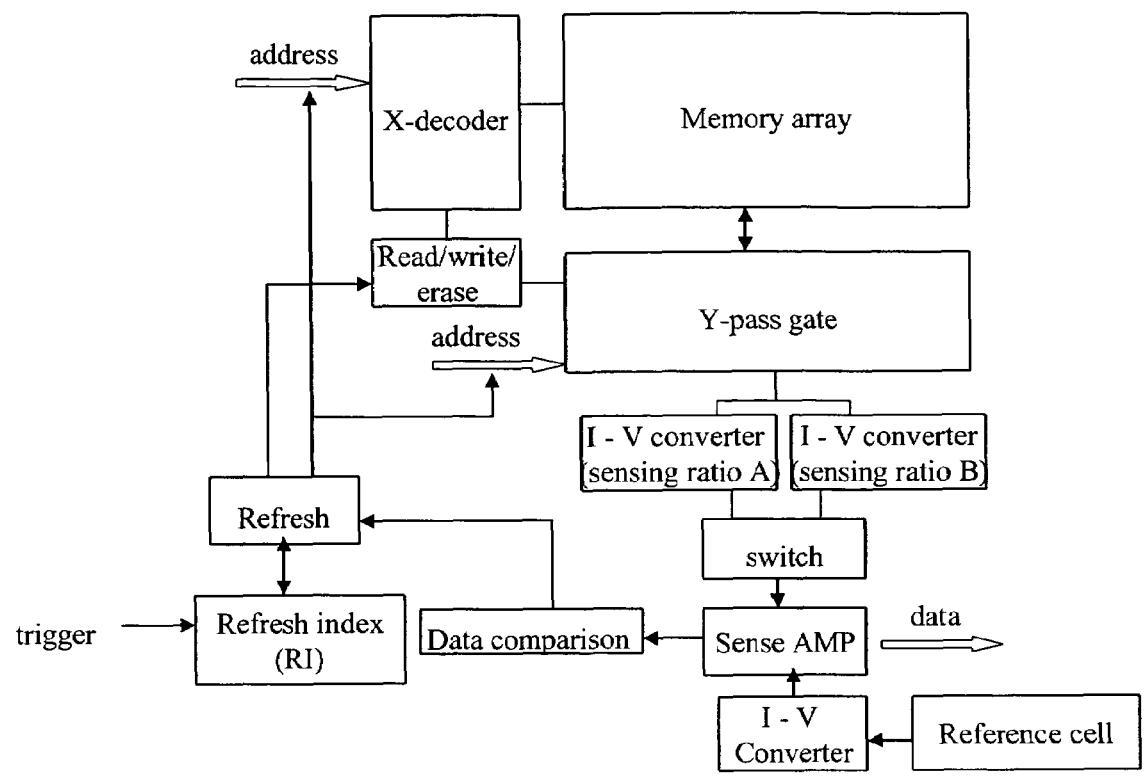
FIGS. 43-54 show block diagrams for refreshing cells.

FIG. 43 shows a block diagram refreshing only the high threshold voltage charge loss cell using a difference sensing ratio method on the cell side. For example, sensing ratio A is 1:1 and sensing ratio B is 1:X, X>1 such as X=2.

Figure 44:
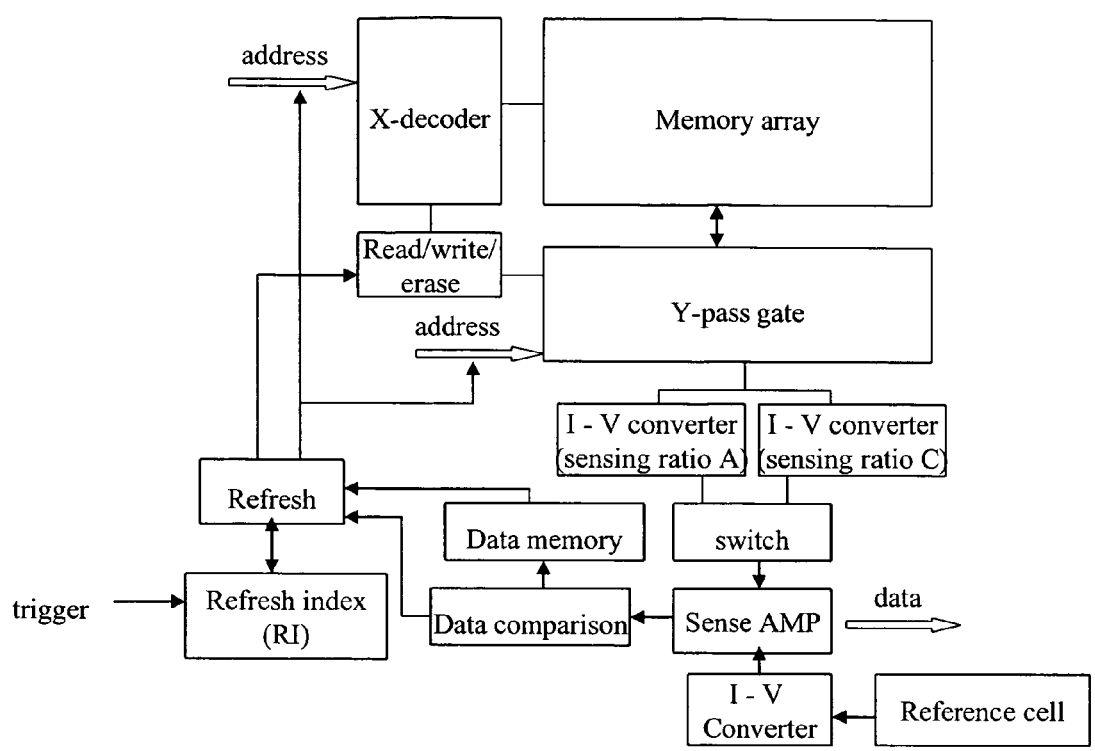

FIG. 44 shows a block diagram refreshing only the low threshold voltage charge gain cell using a difference sensing ratio method on the cell side. For example, sensing ratio A is 1:1 and sensing ratio C is 1:Y, Y<1 such as Y=2/3.

Figure 45:
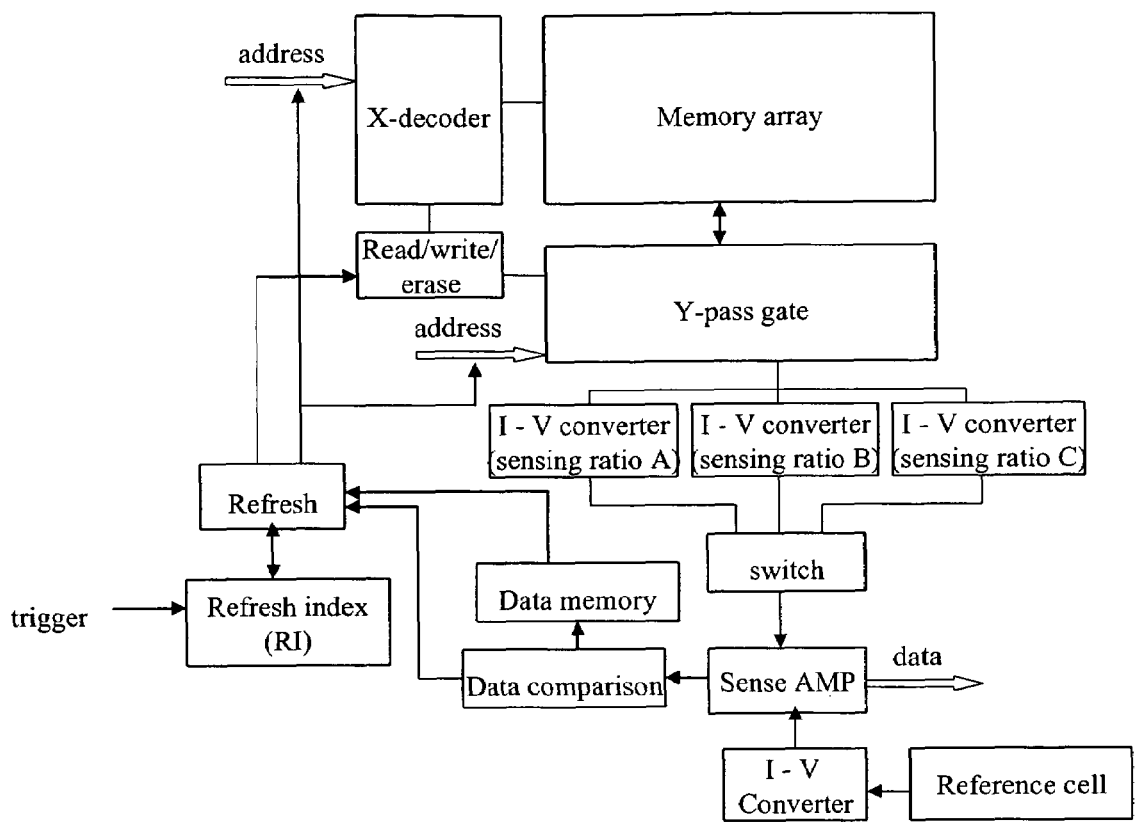

FIG. 45 shows a block diagram refreshing both the high threshold voltage charge loss cell and the low threshold voltage charge gain cells using a difference sensing ratio method on the cell side. For example, sensing ratio A is 1:1, sensing ratio B is 1:X, X>1 such as X=2 and sensing ratio C is 1:Y, Y<1 such as Y=2/3.

Figure 46:
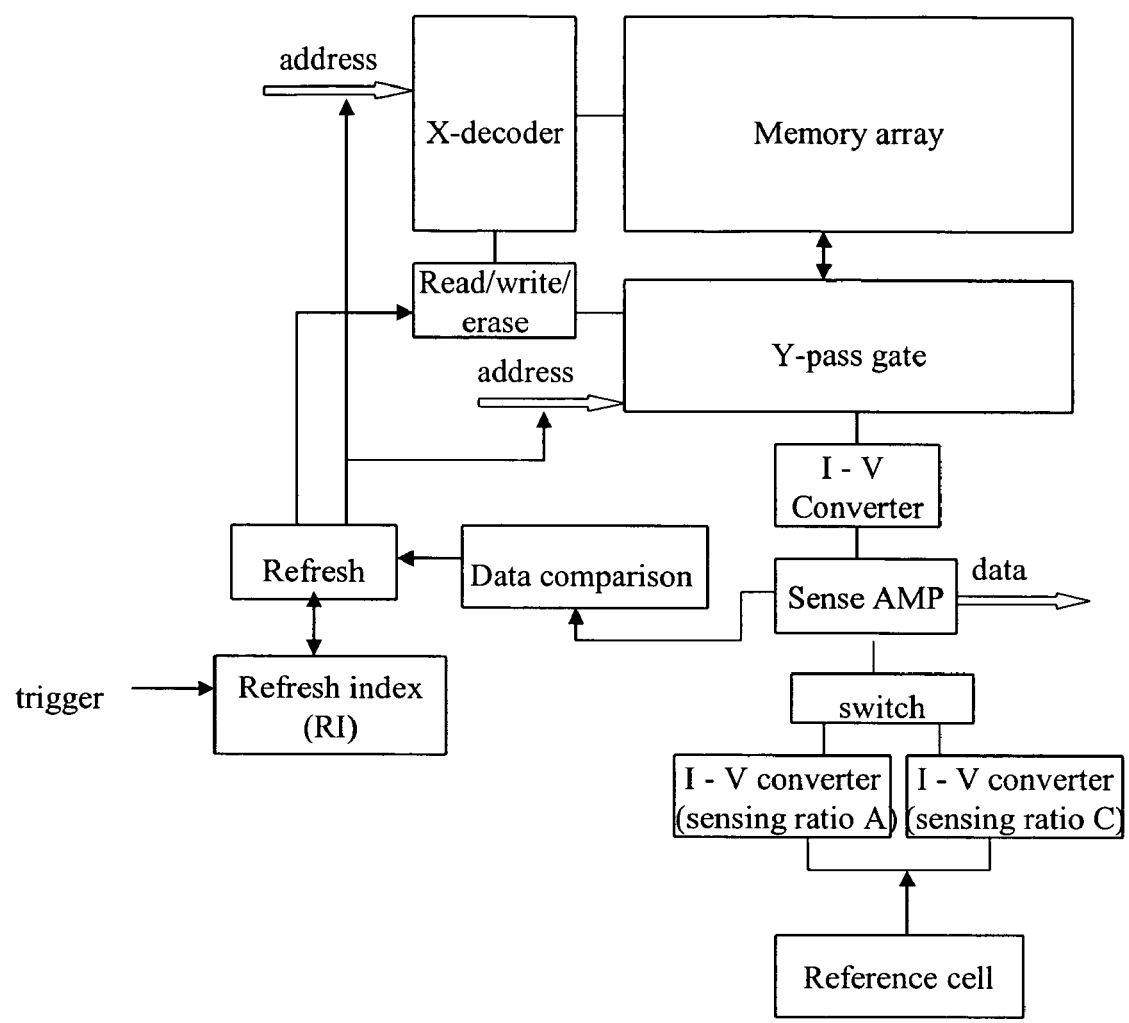

FIG. 46 shows a block diagram refreshing only the high threshold voltage charge loss cell using a difference sensing ratio method on the reference cell side. For example, sensing ratio A is 1:1 and sensing ratio C is 1:Y, Y<1 such as X=1/2.

Figure 47:
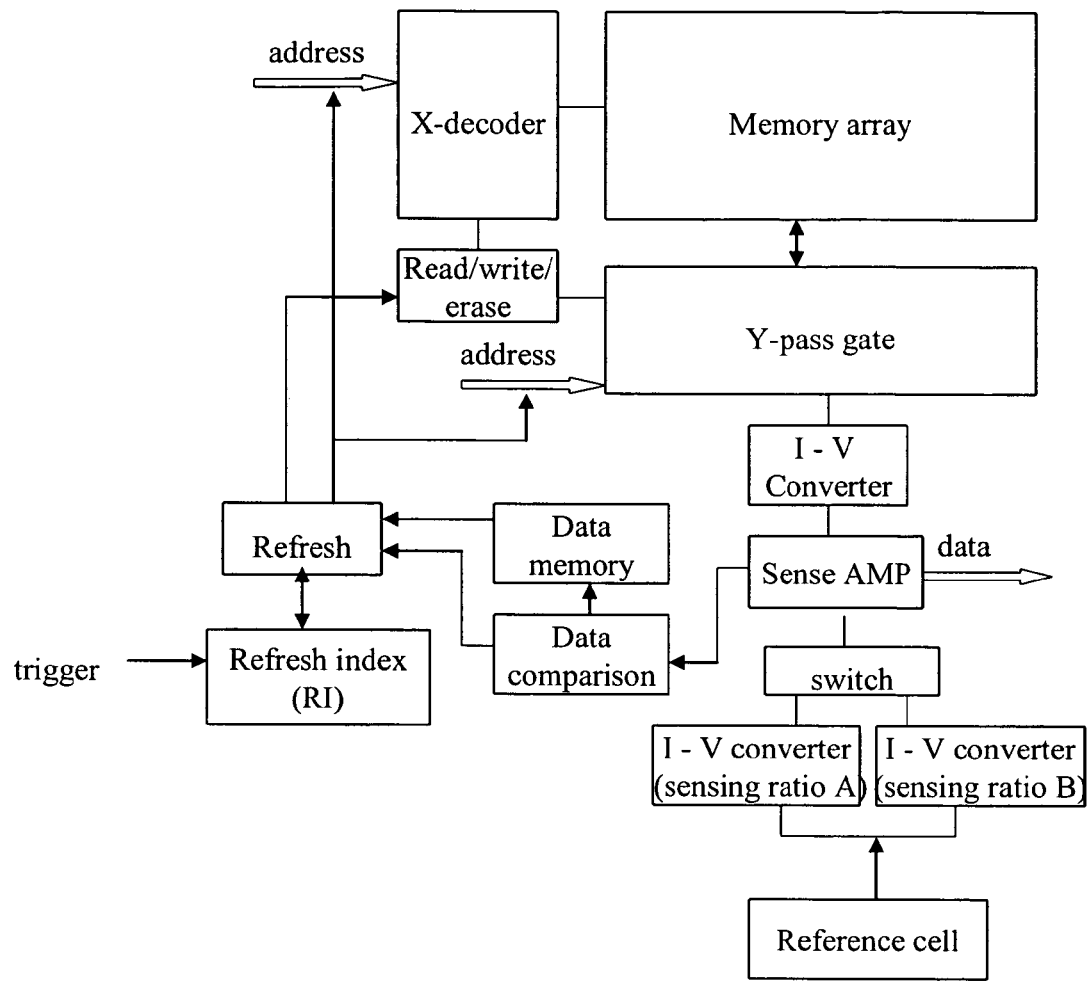

FIG. 47 shows a block diagram refreshing only the low threshold voltage charge gain cell using a difference sensing ratio method on the reference cell side. For example, sensing ratio A is 1:1 and sensing ratio B is 1:X, X>1 such as Y=3/2.

Figure 48:
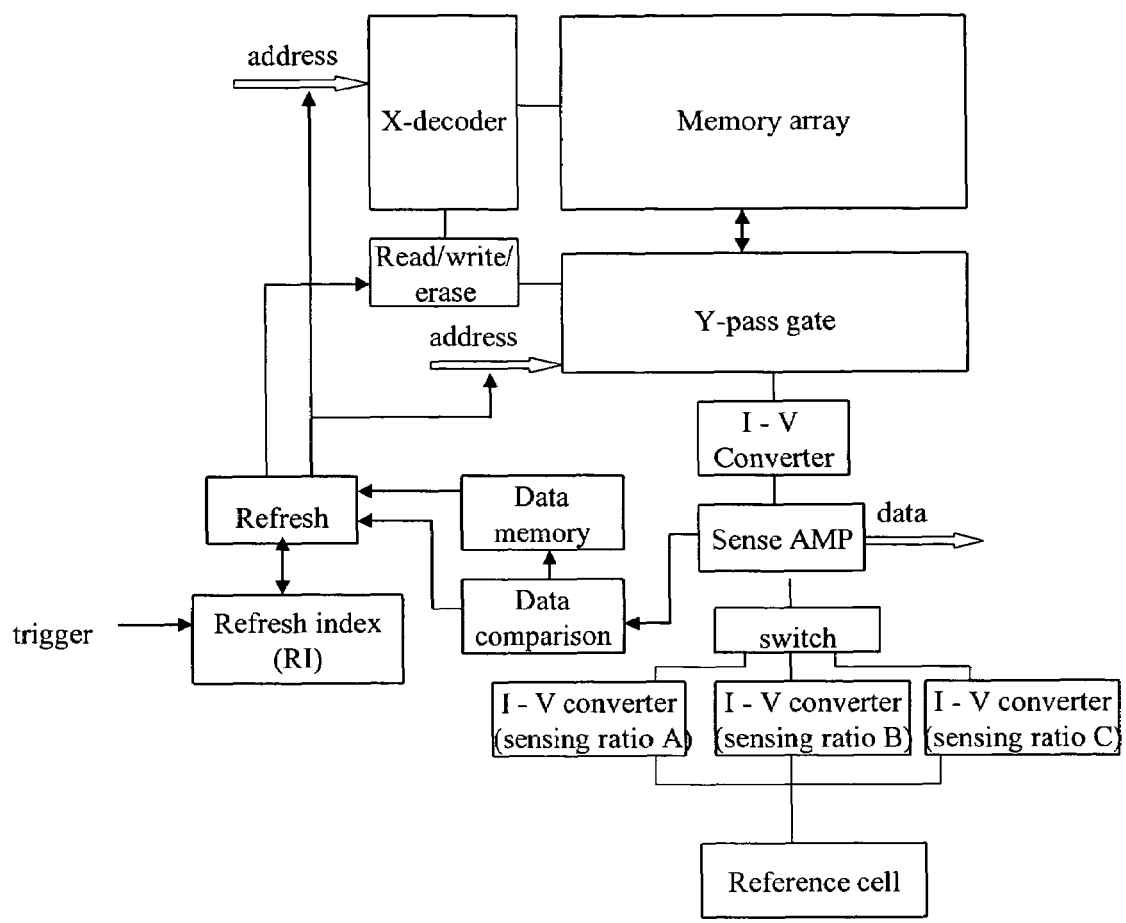

FIG. 48 shows a block diagram refreshing both the high threshold voltage charge loss cell and the low threshold voltage charge gain cells using a difference sensing ratio method on the reference cell side. For example, sensing ratio A is 1:1, sensing ratio B is 1:X, X>1 such as X=3/2 and sensing ratio C is 1:Y, Y<1 such as Y=1/2.

Figure 49:
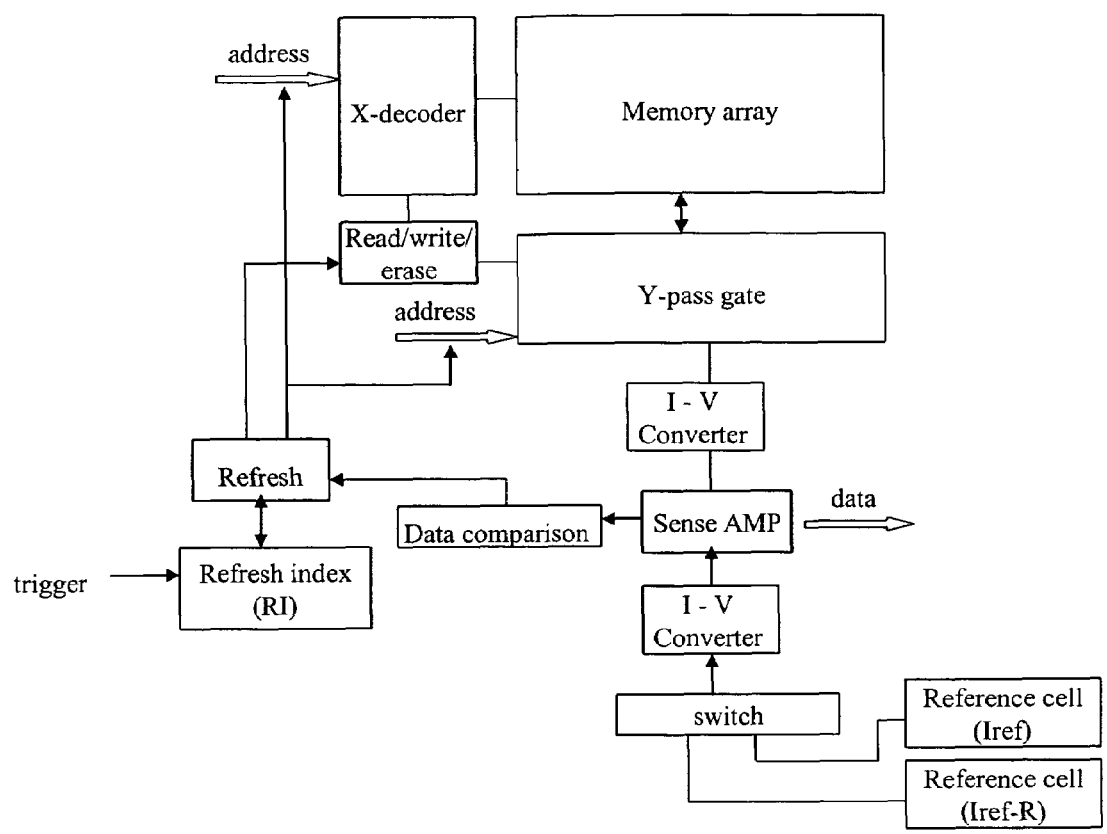

FIG. 49 shows a block diagram refreshing only the high threshold voltage charge loss cell using a difference reference cell method. For example, Iref-R=(1/2)×(Iref).

Figure 50:
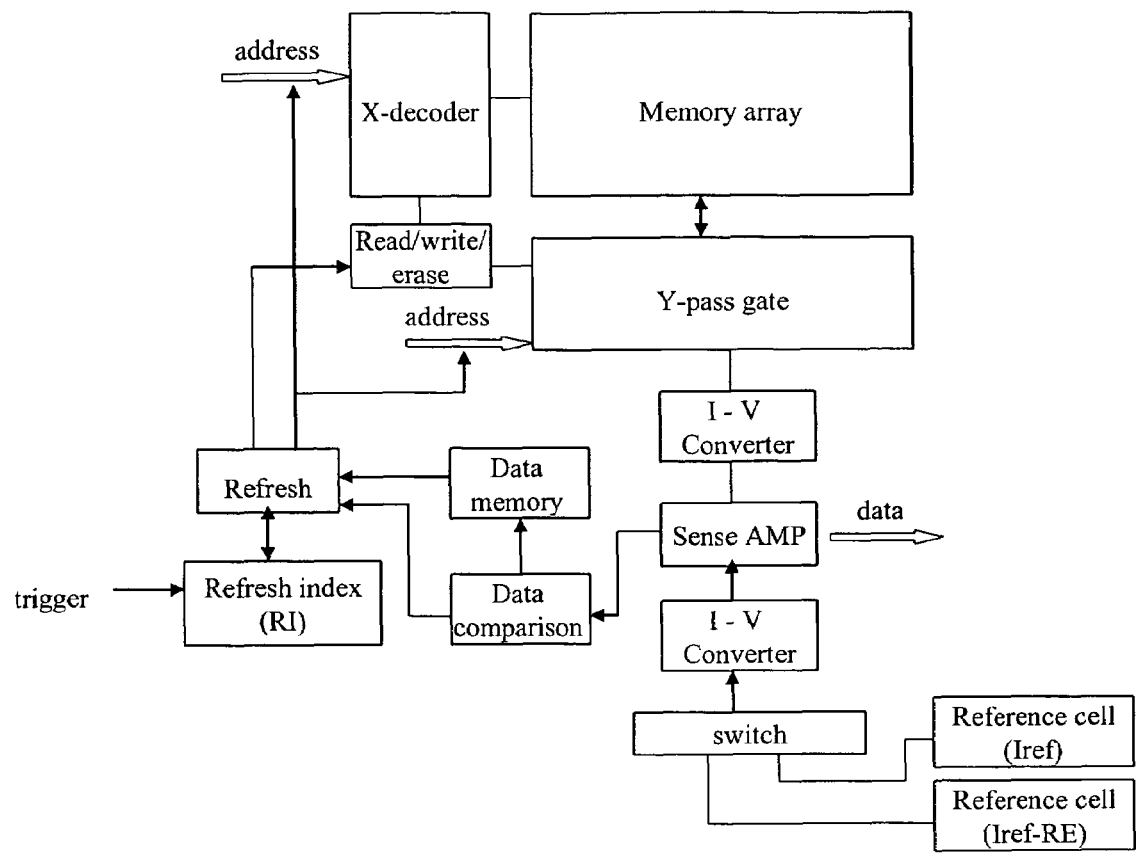

FIG. 50 shows a block diagram refreshing only the low threshold voltage charge gain cell using a difference reference cell method. For example, Iref-RE=(3/2)×(Iref).

Figure 51:
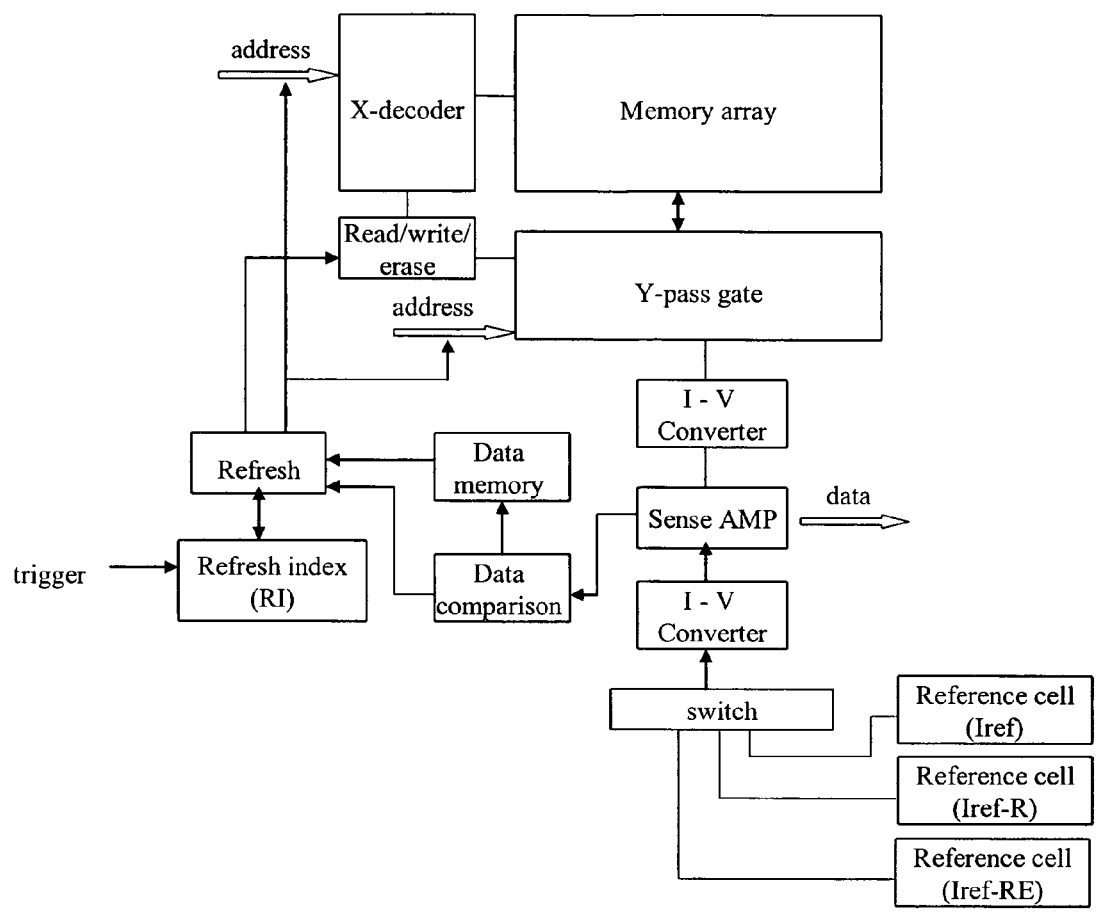

FIG. 51 shows a block diagram refreshing both the high threshold voltage charge loss cell and the low threshold voltage charge gain cell using a difference reference cell method. For example, Iref-RE=(3/2)×(Iref), Iref-R=(1/2)×(Iref).

Figure 52:
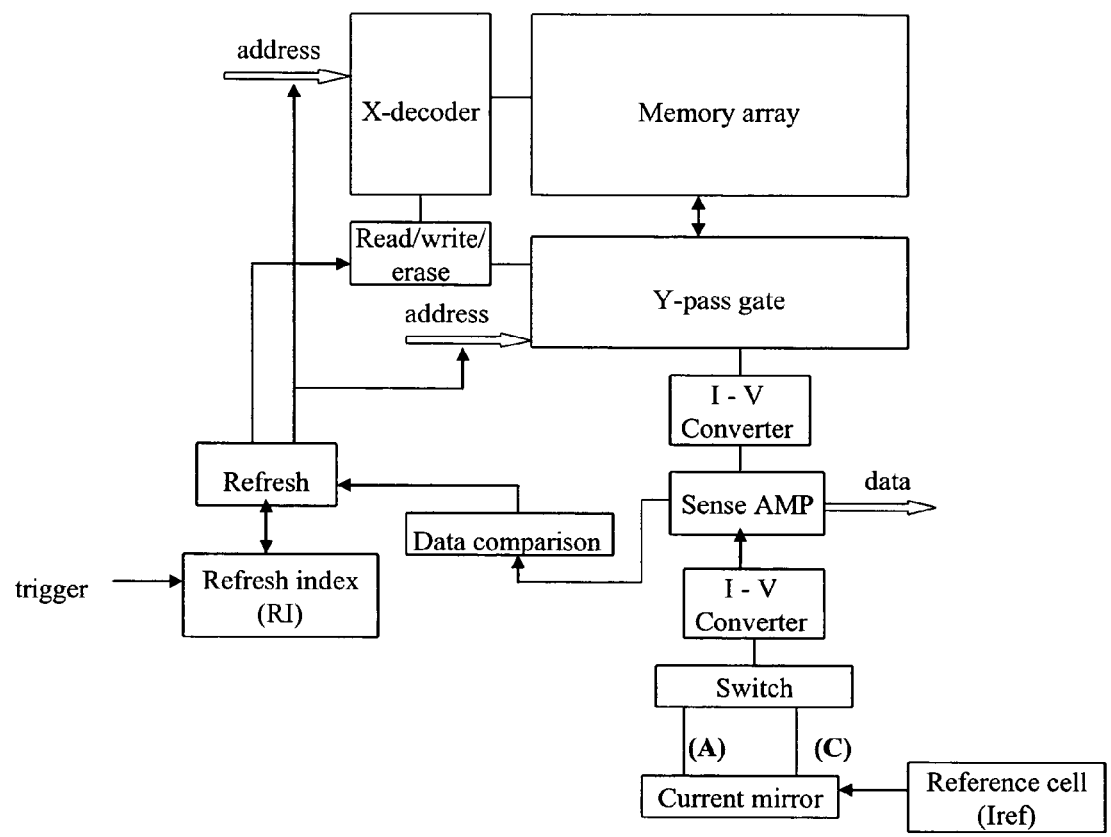

FIG. 52 shows a block diagram refreshing the high threshold voltage charge loss cell using a current mirror method with the current mirror at reference cell side. For example, current mirror A is Iref and current mirror C, Iref-C=(1/2)×(Iref).

Figure 53:
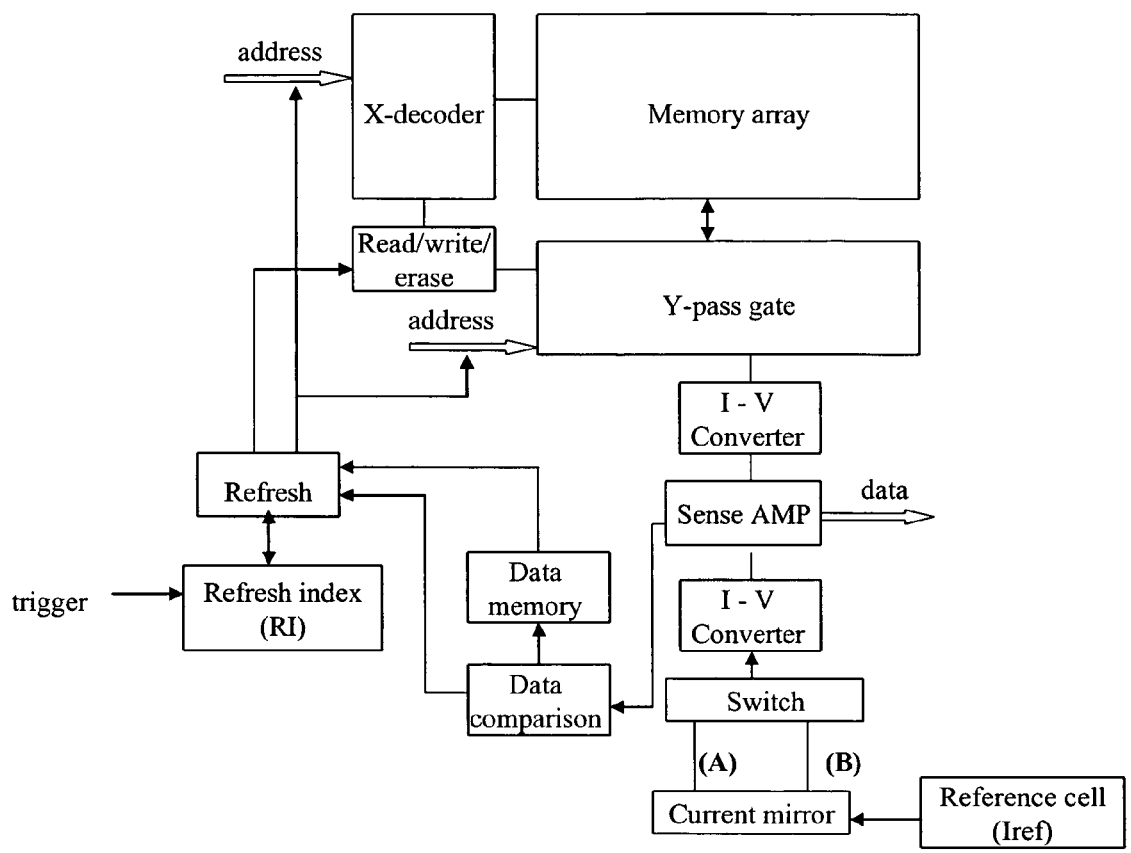

FIG. 53 shows a block diagram refreshing only the low threshold voltage charge gain cell using a current mirror method with the current mirror at the reference cell side. For example, current mirror A is Iref and current mirror B is Iref-B=(3/2)×(Iref).

Figure 54:
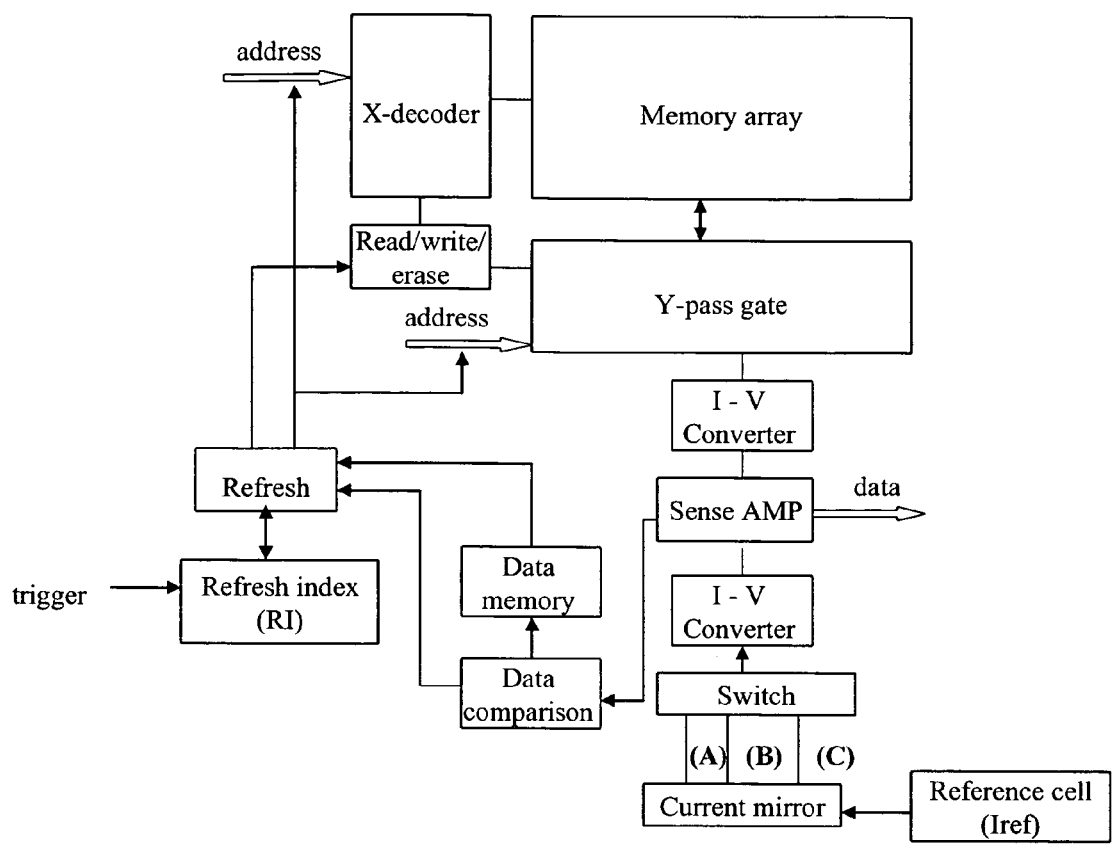

FIG. 54 shows a block diagram refreshing both the high threshold voltage charge loss cell and the low threshold voltage charge gain cells using a current mirror method with the current mirror at the reference cell side. For example, current mirror A is Iref, current B is Iref-B=(3/2)×(Iref) and current mirror C is Iref-C=(1/2)×(Iref).

Figure 55:
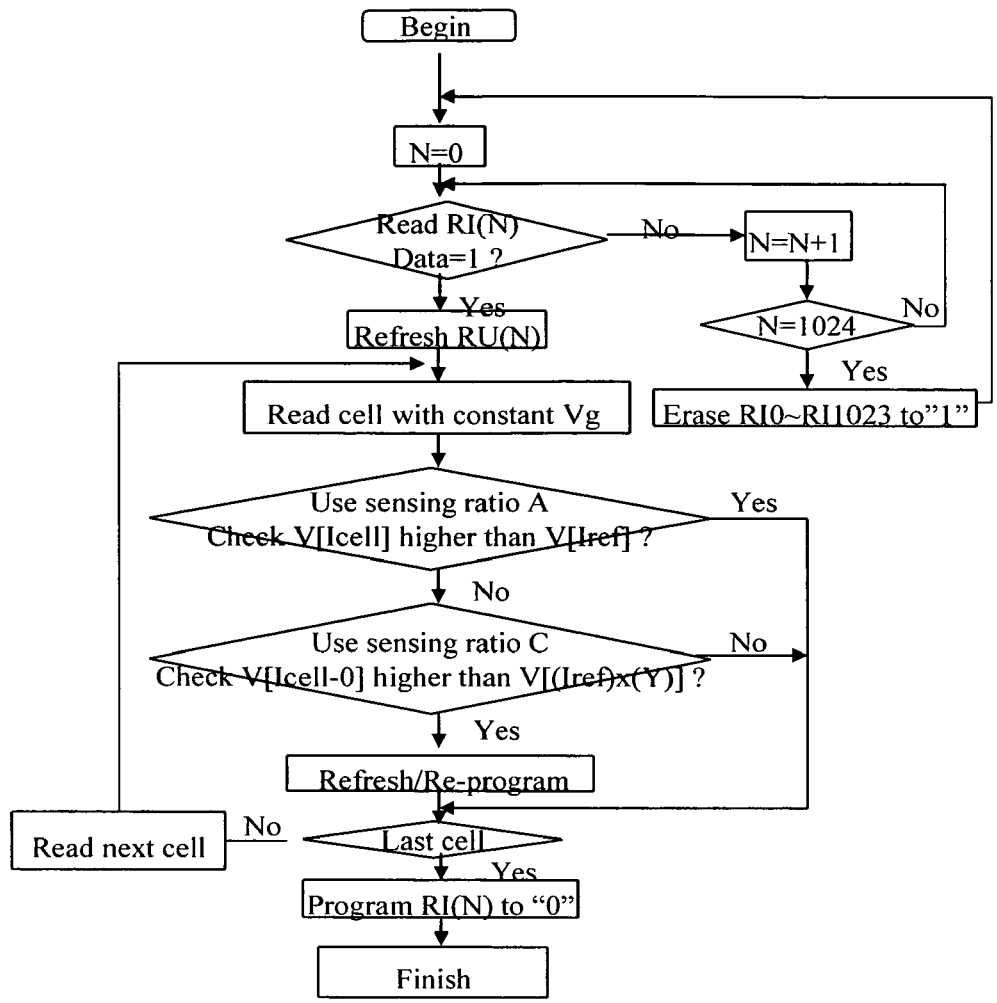
FIG. 55 shows a flow diagram for refreshing cells.
Figure 56:
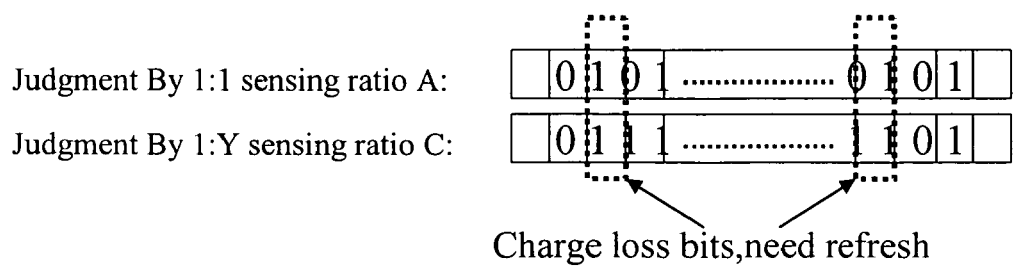
FIG. 56 shows charge loss bits that need refreshing at a reference cell side.

FIG. 55 shows a flow diagram and FIG. 56 shows the charge loss bits that need refreshing at the reference cell side.

FIG. 55 shows the flow diagram for the refresh algorithm using a sensing ratio for "0" cell charge loss on the reference cell side. The algorithm begins by setting N to 0. It reads RI(N) and determines its state. If RI(N)=0, N is incremented by 1. Then it compares the value of N to 1024. If true, it erases RI(0) to RI(1023) with a "1" and the algorithm restarts from the beginning. If false, the algorithm restarts at read RI(N) for the next value of N.

When the data in RI(N)="1", it refreshes RU(N). Next, the cell is read with constant gate voltage, Vg, and sensing ratio A judges V[Icell]>V[Iref]. If V[Icell] is higher than V[Iref], it tests the cell for the last cell. If false, it reads the next cell with the constant gate voltage, Vg, and starts the sensing ratio A over. If it is the last cell, it programs RI(N) with a "0" and the algorithm finishes.

If V[Icell] is lower than V[Iref], then sensing ratio C judges V[Icell-0]>V[(Iref)×(Y)]. If V[Icell-0] is lower than V[(Iref)×(Y)], a test for the last cell is done. If false, it reads the next cell with the constant gate voltage, Vg, and starts the sensing ratio A over. If true, then it programs RI(N) with a "0" and the algorithm finishes. If V[Icell-0] is higher than V[(Iref)×(Y)], it refreshes and reprograms the cell. Then it tests the cell for the last cell. If false, it reads the next cell with the constant gate voltage, Vg, and starts the sensing ratio A over. If true, it programs RI(N) with a "0" and the algorithm finishes.

FIG. 56 shows an example of which bits need refreshing of using the sensing ratios A and C. For example, sensing ratio A is 1:1 and sensing ratio C is 1:Y, Y=1/2 and the FIG. 56 shows where the refreshing occurs.

Figure 57:
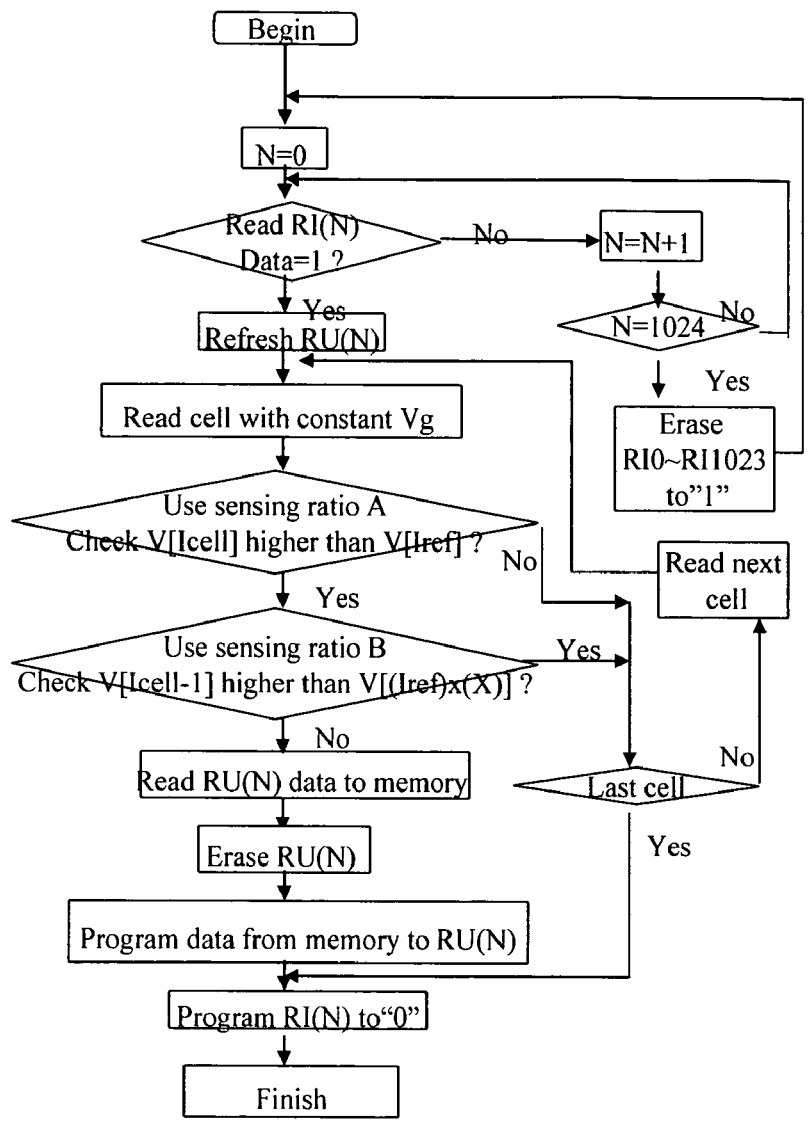
FIGS. 57 and 58 show flow diagrams and which charge gain bits need refreshing at the reference cell side.
Figure 58:
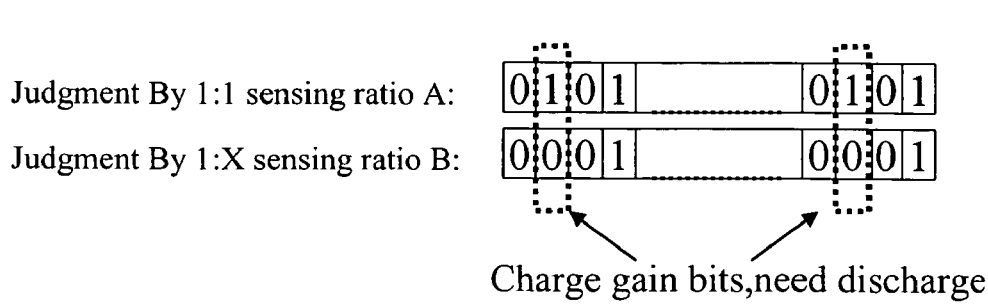

FIGS. 57 and 58 show a flow diagram and which charge gain bits need refreshing at the reference cell side.

FIG. 57 shows the flow diagram for the refresh algorithm using a sensing ratio for "1" cell charge gain on the reference cell side. The algorithm begins by setting N to 0. It reads RI(N) and determines its state. If RI(N)=0, N is incremented by 1. Then, it compares N to 1024, if true it erases RI(0) to RI(1023) with a "1" and the algorithm restarts from the beginning. If false, the algorithm restarts at read RI(N) for the next value of N.

When the data in RI(N)="1", it refreshes RU(N). Next, the cell is read with constant gate voltage, Vg, and sensing ratio A judges V[Icell]>V[Iref]. If V[Icell] is lower than V[Iref], then it tests the cell for the last cell. If false, it reads the next cell with the constant gate voltage, Vg, and starts the sensing ratio A over. If it is the last cell, it programs RI(N) with a "0" and the algorithm finishes.

If V[Icell] is higher than V[Iref], then sensing ratio B judges V[Icell-1]>V[(Iref)×(X)]. If V[Icell-1] is higher than V[(Iref)×(X)], a test for the last cell is done. If false, it reads the next cell with the constant gate voltage, Vg, and starts the sensing ratio A over. If true, it programs RI(N) with a "0" and the algorithm finishes. If V[Icell-1] is lower than V[(Iref)× (X)], it reads the RU(N) data to memory, then it erases RU(N) and programs the data from memory to RU(N). Finally, it programs RI(N) with "0" and finishes.

FIG. 58 shows an example of which bits need refreshing as a result of using ratios A and B. For example, sensing ratio A is 1:1 and sensing ratio B is 1:X, X=3/2 and FIG. 58 shows where the refreshing occurs.

Figure 59:
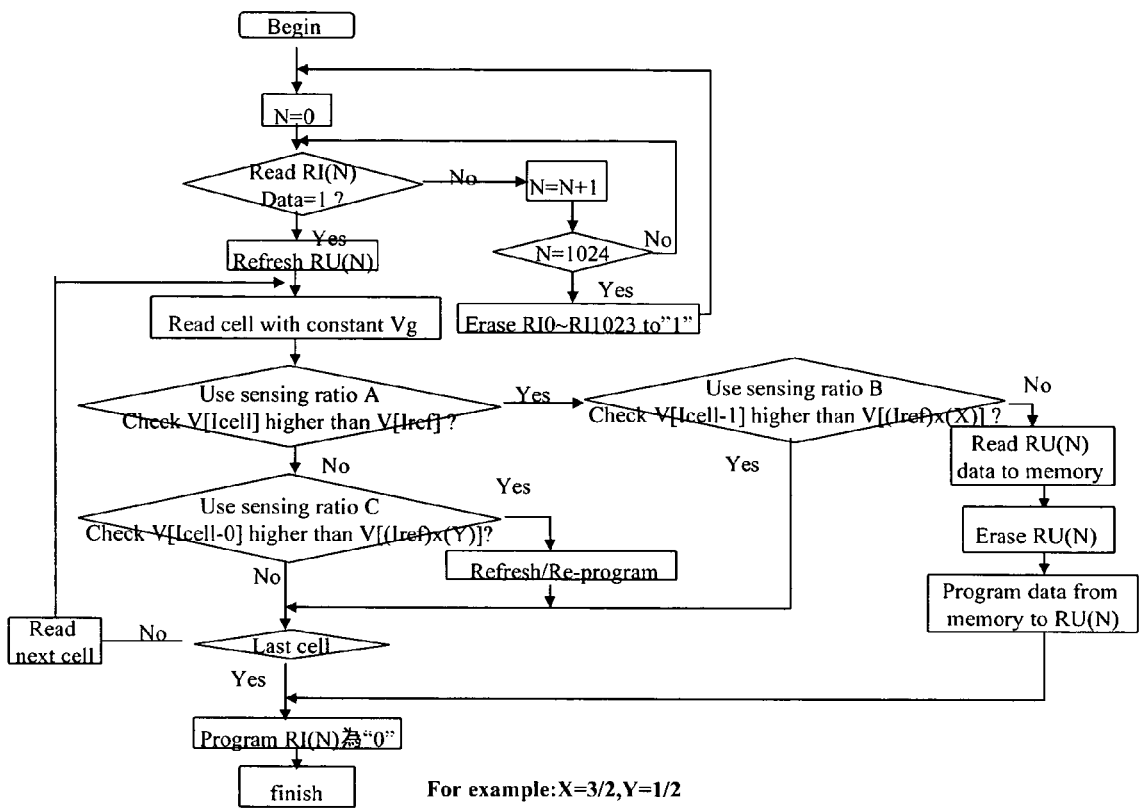
FIG. 59 shows a refreshing algorithm for both "0" charge loss and "1" cell charge gain for a reference cell side sensing ratio.

FIG. 59 shows the refreshing algorithm for both "0" charge loss and "1" cell charge gain for the reference cell side sensing ratio.

The algorithm begins by setting N to 0, next it reads RI(N). If RI(N) is 0, N is incremented by 1 and it tests for N=1024. If N equals 1024, it erases RI(0) to RI(1023) to "1", if N less than 1024, the algorithm starts at read RI(N) for the next value of N. When RI(N) is "1", the algorithm refreshes RU(N). Next the cell is read using a constant gate voltage, Vg, and sensing ratio A judges V[Icell]>V[Iref]. If V[Icell] is lower than V[Iref], sensing ratio C judges V[Icell-0]>V[(Iref)×(Y)]. If V[Icell-0] is higher, it refreshes and reprograms the cell. Then it tests the cell for the last cell. If V[Icell-0] is lower, then it tests the cell for the last cell. If it is not the last cell, it reads the next cell with the constant gate voltage, Vg, and starts the sensing ratio A over. If it is the last cell, it programs RI(N) with a "0" and the algorithm finishes.

However, if V[Icell] is higher, then sensing ratio B judges V[Icell-1]>V[(Iref)×(X)]. If V[Icell-1] is higher, then it tests the cell for the last cell. If V[Icell-1] is lower, it reads RU(N) data to memory and then it erases RU(N). Next, it programs the data from memory to RU(N), then programs RI(N) to "0" and finishes.

In an alternative embodiment of the present invention, Iref may be a generated reference cell current level, and not the reference cell current of an actual reference cell.

In one preferred embodiment of the present invention, the single and lower control gate voltage can range from about 0V to about 10V.

In FIG. 29, the current mirror is used to generate current (A) and current (C). Current (A) is the same value as the reference cell current, Iref, and current (C) is half of the value of the reference cell current, Iref.

The present invention shortens the process development time and provides high data retention and endurance, which uses a circuit design method without increasing the process complexity.

It will be appreciated by those skilled in the art that changes could be made to the embodiments described above without departing from the broad inventive concept thereof. It is understood, therefore, that this invention is not limited to the particular examples disclosed, but it is intended to cover modifications within the spirit and scope of the present invention as defined by the appended claims.

What is claimed is:

1. A method for refreshing cells of a flash memory, the method comprising steps of:
    (a) reading the cells of the flash memory;
    (b) using a plurality of different sensing ratios to determine if any of the cells need to be refreshed; and
    (c) refreshing any cell that is determined to need refreshing.

2. The method of claim 1 wherein the cells of the flash memory are read in step (a) using only a single constant gate voltage.

3. The method of claim 1 wherein one sensing ratio is 1:1 and another sensing ratio is 1:X, wherein X>1.

4. The method of claim 1 wherein one sensing ratio is 1:1 and another sensing ratio is 1:Y, where Y<1.

5. The method of claim 1 wherein the constant gate voltage is about 0 volt to about 10 volts.

6. The method of claim 1 wherein at least some of the cells are high Vt (threshold voltage) charge loss cells.

7. The method of claim 1 wherein at least some of the cells are low Vt (threshold voltage) charge gain cells.

8. The method of claim 1 wherein at least some of the cells are high Vt (threshold voltage) charge gain cells and at least some of the cells are low Vt (threshold voltage) charge gain cells.

9. A method for refreshing a cell of a flash memory, the method comprising:
(a) reading the cell;
(b) measuring a cell current of the cell and converting the cell current to a converted voltage at a first sensing ratio;
(c) providing a reference cell current level and converting the reference cell current level to a converted voltage of the reference cell;
(d) comparing the converted voltage of the cell current to the converted voltage of the reference cell; and
(e)(i) if the converted voltage of the cell current is higher than the converted voltage of the reference cell, perform steps (a)-(d) for a next cell, and
(e)(ii) if the converted voltage of the cell current is not higher than the converted voltage of the reference cell, convert the cell current to a converted voltage at a second sensing ratio that is different than the first sensing ratio, compare the converted voltage of the cell current to the converted voltage of the reference cell, and if the converted voltage of the cell current is higher than the converted voltage of the reference cell, refresh the cell, and if the converted voltage of the cell current is not higher than the converted voltage of the reference cell, perform steps (a)-(d) for the next cell.

10. The method of claim 9 wherein the cell of the flash memory is read in step (a) using only a single constant gate voltage.

11. The method of claim 9 wherein the cell is a charge loss cell.

12. The method of claim 9 wherein the first sensing ratio is 1:1 and the second sensing ratio is 1:X, where X>1.

13. The method of claim 9 wherein the first sensing ratio is 1:1 and the second sensing ratio is 1:Y, where Y<1.

14. A method for refreshing a cell of a flash memory, the method comprising:
(a) reading the cell;
(b) measuring a cell current of the cell and converting the cell current to a converted voltage at a first sensing ratio;
(c) providing a reference cell current level and converting the reference cell current level to a converted voltage of the reference cell;
(d) comparing the converted voltage of the cell current to the converted voltage of the reference cell; and
(e)(i) if the converted voltage of the cell current is not higher than the converted voltage of the reference cell, perform steps (a)-(d) for a next cell, and
(e)(ii) if the converted voltage of the cell current is higher than the converted voltage of the reference cell, convert the cell current to a converted voltage at a second sensing ratio that is different than the first sensing ratio, compare the converted voltage of the cell current to the converted voltage of the reference cell, and if the converted voltage of the cell current is not higher than the converted voltage of the reference cell, refresh the cell, and if the converted voltage of the cell current is higher than the converted voltage of the reference cell, perform steps (a)-(d) for the next cell.

15. The method of claim 14 wherein the cell of the flash memory is read in step (a) using only a single constant gate voltage.

16. A circuit for refreshing cells of a flash memory, the circuit comprising:
(a) a sense amplifier including:
(i) a first input that accepts a converted voltage of a cell current of a cell to be tested, and
(ii) a second input that accepts a converted voltage of a reference cell current level;
(b) a plurality of current to voltage converters, each of the current to voltage converters having a different sensing ratio, the input of each of the current to voltage converters being coupled to the output of the cell to be tested; and
(c) a switch that allows the output of only one of the current to voltage converters to be electrically connected to the first input of the sense amplifier at a given time,
wherein the output of the sense amplifier is used to decide whether to refresh a particular cell of the flash memory.

17. A circuit for refreshing cells of a flash memory, the circuit comprising:
(a) a sense amplifier including:
(i) a first input that accepts a converted voltage of a cell current of a cell to be tested, and
(ii) a second input that accepts a converted voltage of a reference cell current level;
(b) a plurality of current to voltage converters associated with a reference cell, each current to voltage converters having a different sensing ratio, the input of each of the current to voltage converters being coupled to a output of the reference cell; and
(c) a switch that allows the output of only one of the current to voltage converters to be electrically connected to the second input of the sense amplifier at a given time,
wherein the output of the sense amplifier is used to decide whether to refresh a particular cell of the flash memory.

18. A circuit for refreshing cells of a flash memory, the circuit comprising:
(a) a sense amplifier including:
(i) a first input that accepts a converted voltage of a cell current of a cell to be tested, and
(ii) a second input that accepts a converted voltage of a reference cell current level;
(b) a plurality of reference cells, each reference cell having a different reference current; and
(c) a switch that allows the output of only one of the reference cells to be electrically connected to the second input of the sense amplifier at a given time,
wherein the output of the sense amplifier is used to decide whether to refresh a particular cell of the flash memory.

* * * * *